United States Patent
Masuda et al.

(10) Patent No.: US 11,137,640 B2
(45) Date of Patent: Oct. 5, 2021

(54) LIGHTING DEVICE WITH OFFSET LAND PATTERNS

(71) Applicant: SHARP KABUSHIKI KAISHA, Sakai (JP)

(72) Inventors: Takeshi Masuda, Sakai (JP); Hisashi Watanabe, Sakai (JP); Youzou Kyoukane, Sakai (JP); Hirotoshi Yasunaga, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 16/785,526

(22) Filed: Feb. 7, 2020

(65) Prior Publication Data

US 2021/0247647 A1    Aug. 12, 2021

(51) Int. Cl.
| | |
|---|---|
| *G02F 1/13357* | (2006.01) |
| *H05K 1/11* | (2006.01) |
| *H05K 1/18* | (2006.01) |
| *G02F 1/1335* | (2006.01) |

(52) U.S. Cl.
CPC .. *G02F 1/133603* (2013.01); *G02F 1/133605* (2013.01); *G02F 1/133606* (2013.01); *H05K 1/111* (2013.01); *H05K 1/181* (2013.01); *G02F 1/133612* (2021.01); *H05K 2201/10106* (2013.01)

(58) Field of Classification Search
CPC .................................................. H05K 1/111
See application file for complete search history.

(56) References Cited

U.S. PATENT DOCUMENTS

| | | | | |
|---|---|---|---|---|
| 10,942,599 | B2* | 3/2021 | Choi | H05K 1/111 |
| 2001/0022564 | A1* | 9/2001 | Youngquist | H01L 25/0753 |
| | | | | 345/55 |
| 2004/0145913 | A1* | 7/2004 | Ouderkirk | H01L 33/505 |
| | | | | 362/555 |
| 2008/0037279 | A1* | 2/2008 | Chan | G02F 1/133603 |
| | | | | 362/612 |
| 2011/0051397 | A1* | 3/2011 | Bae | G02B 6/0073 |
| | | | | 362/97.1 |
| 2011/0261286 | A1* | 10/2011 | Choi | G02F 1/133611 |
| | | | | 349/61 |

(Continued)

FOREIGN PATENT DOCUMENTS

JP    2010-097783 A    4/2010

*Primary Examiner* — Jong-Suk (James) Lee
*Assistant Examiner* — Eric T Eide
(74) *Attorney, Agent, or Firm* — ScienBiziP, P.C.

(57) ABSTRACT

A lighting device includes a mounting substrate comprising a first pair of conductive pads and a second pair of conductive pads arranged along a first direction on the mounting substrate. The first pair of conductive pads is offset from the second pair of conductive pads in the first direction and a second direction intersecting the first direction with respect to a plane parallel to the mounting substrate. A first light emitting device is coupled to the first pair of conductive pads, and configured to emit lights toward a first side within a space formed between the mounting substrate and a diffusion plate. A second light emitting device is coupled to the second pair of conductive pads, and configured to emit lights toward a second side opposite of the first side within the space formed between the substrate and the diffusion plate.

13 Claims, 14 Drawing Sheets

(56) References Cited

U.S. PATENT DOCUMENTS

| | | | |
|---|---|---|---|
| 2012/0242935 A1* | 9/2012 | Yang | G02F 1/133603 |
| | | | 349/67 |
| 2013/0328074 A1* | 12/2013 | Lowes | H01L 33/54 |
| | | | 257/89 |
| 2015/0325755 A1* | 11/2015 | Speer | H01L 33/486 |
| | | | 257/99 |
| 2017/0338392 A1* | 11/2017 | Marutani | H01L 33/647 |
| 2020/0343407 A1* | 10/2020 | Minato | H05K 3/005 |

* cited by examiner

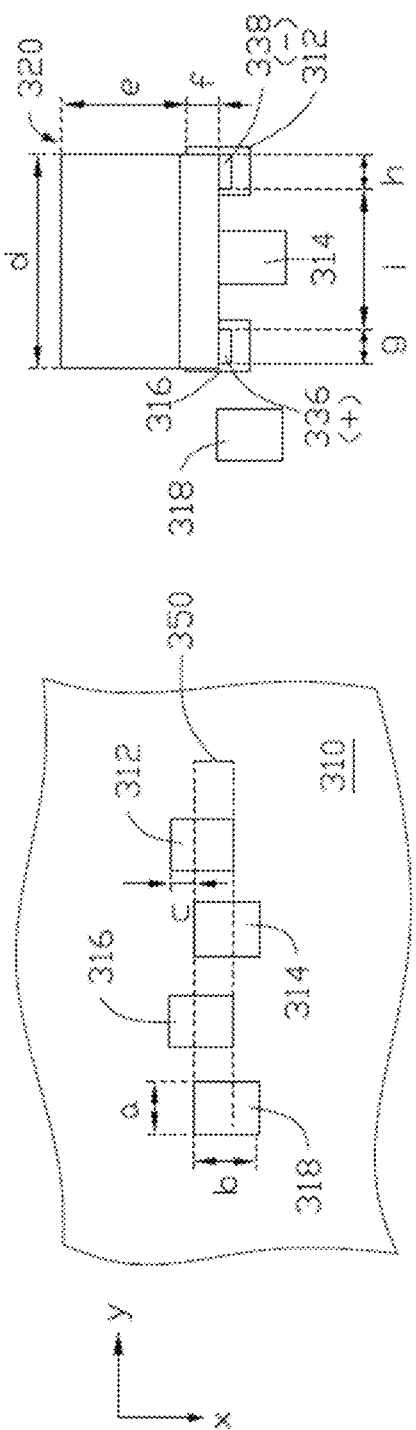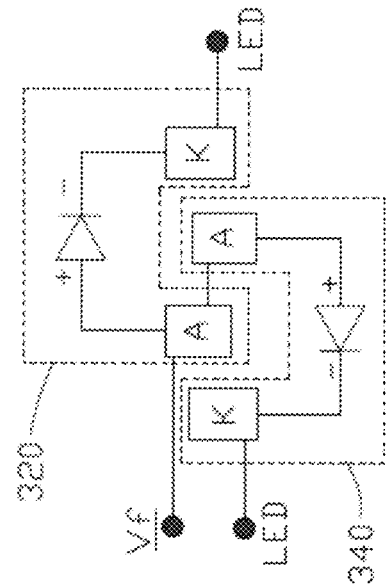
FIG. 3A  FIG. 3B  FIG. 3C  FIG. 3D

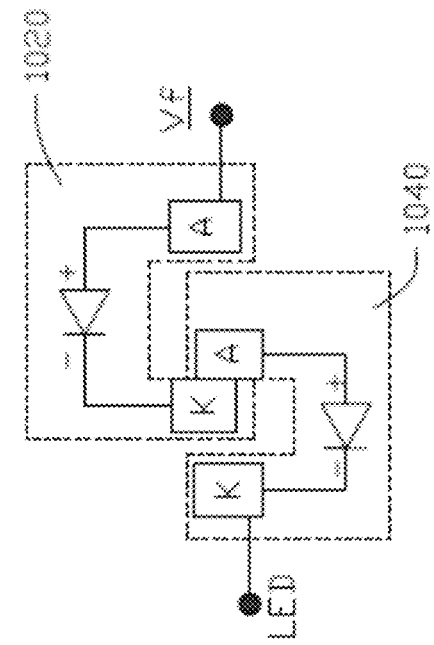
FIG. 10B
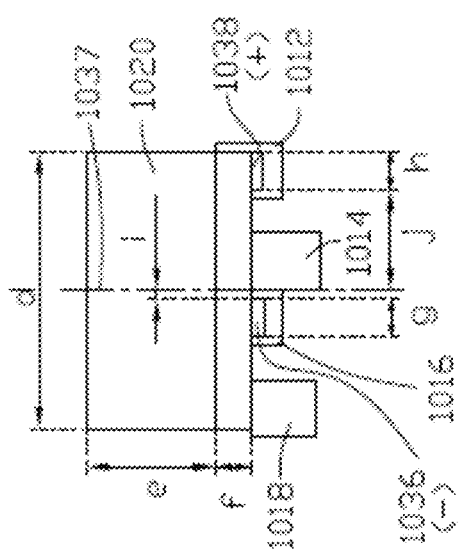
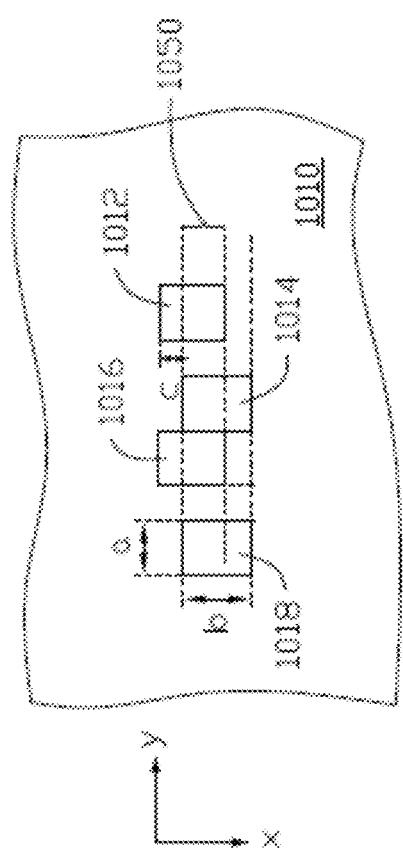
FIG. 10A
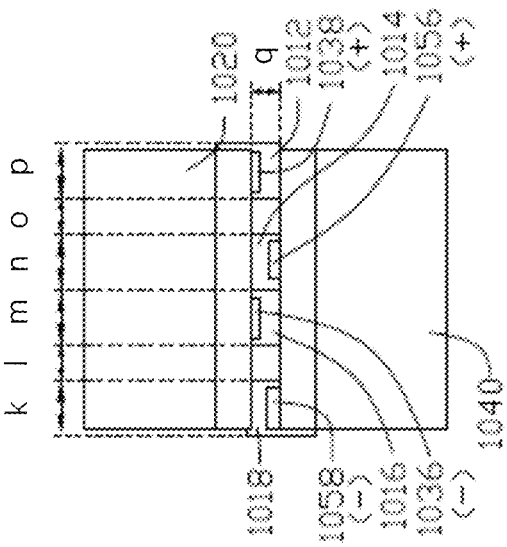
FIG. 10C
FIG. 10D

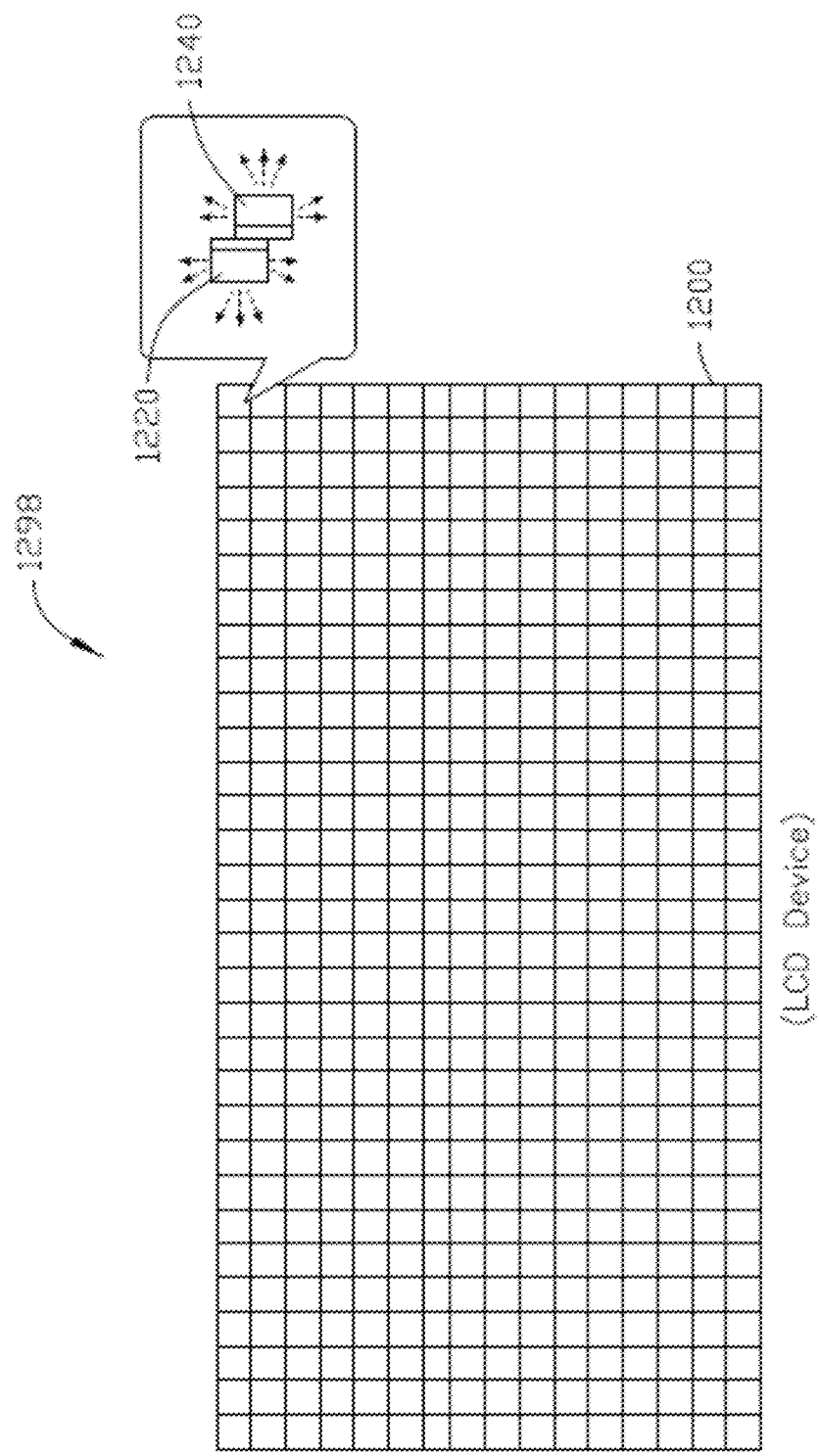

LIGHTING DEVICE WITH OFFSET LAND PATTERNS

FIELD

The present disclosure generally relates to a lighting device having light emitting devices arranged on offset land patterns.

BACKGROUND

A light device, such as a backlight device, may include light emitting devices arranged on a substrate. Each of the light emitting devices may include two electrodes arranged symmetrically at the ends of the light emitting device for electrical connection through landing patterns on the substrate. Conventional landing patterns are symmetrically aligned with one another to match the patterns of the electrodes of the light emitting devices. Such an arrangement of the light emitting devices and landing patterns on the substrate may result in a dark spot between every pair of adjacent light emitting devices facing away from each other. The dark spot between each pair of light emitting devices is a non-emission region which can affect the uniformity of luminance distribution of the backlight device. Generally, the greater the non-emission region, the more uneven the backlight illumination may appear.

FIG. 14A shows a perspective view of a related art light emitting device. As shown in FIG. 14A, light emitting device 1480 includes a pair of electrodes 1482 and 1484 arranged symmetrically on each end of light emitting device 1480. FIG. 14B shows a top plan view of two of the related art light emitting devices illustrated in FIG. 14A, each having electrodes coupled to their corresponding landing pads. As shown in FIG. 14B, the space between light emitting devices 1480A and 1480B form non-emission region 1498 (e.g., a dark spot).

Thus, there is a need in the art to arrange each pair of the light emitting devices as closely as possible to minimize or substantially eliminate the non-emission region therebetween.

SUMMARY

The present disclosure generally relates to a lighting device having light emitting devices arranged on offset land patterns.

In a first aspect of the present disclosure, a lighting device includes a mounting substrate comprising a first pair of conductive pads and a second pair of conductive pads arranged along a first direction on the mounting substrate, the first pair of conductive pads being offset from the second pair of conductive pads in the first direction and a second direction intersecting the first direction with respect to a plane parallel to the mounting substrate; a first light emitting device coupled to the first pair of conductive pads, and being configured to emit lights toward a first side within a space formed between the mounting substrate and a diffusion plate; and a second light emitting device coupled to the second pair of conductive pads, and being configured to emit lights toward a second side opposite of the first side within the space formed between the substrate and the diffusion plate.

According to one implantation of the first aspect, the first pair of conductive pads overlaps with the second pair of conductive pads along the second direction in an overlapping region.

According to another implantation of the first aspect, the first pair of conductive pads includes a first conductive pad and a third conductive pad to which a first electrode and a second electrode of the first light emitting device are connected respectively; the second pair of conductive pads includes a second conductive pad and a fourth conductive pad to which a third electrode and a fourth electrode of the second light emitting device are connected respectively; the first, second, third, and fourth conductive pads are disposed in alternately offset positions.

According to yet another implantation of the first aspect, each of the first and second light emitting devices includes a first electrode and a second electrode; the first and second electrodes are arranged symmetrically with respect to a center line parallel to the first and second electrodes and on a surface of a light emitting element mounting backboard of the respective first or second light emitting device; the center line of the first light emitting device and the center line of the second light emitting device are offset from each other.

According to yet another implantation of the first aspect, each of the first and second light emitting devices include a first electrode and a second electrode; the first and second electrodes are arranged asymmetrically with respect to a center line parallel to the first and second electrodes and on a surface of a light emitting element mounting backboard of the respective first or second light emitting device; the center line of the first light emitting device and the center line of the second light emitting device are aligned with each other.

According to yet another implantation of the first aspect, the second and third conductive pads are connected to each other to form a single node such that the first light emitting device and the second light emitting device are connected in series with each other.

According to yet another implantation of the first aspect, at least one of the first and second light emitting devices is a side-emitting light device comprising: a light-emitting element disposed on a light-emitting element mounting backboard; a sealing resin covering the light-emitting element; a first electrode and a second electrode coupled to the light-emitting element.

According to yet another implantation of the first aspect, the side-emitting light device further comprises at least one of: a top reflector layer covering a top surface of the sealing resin, and a bottom reflector layer covering a bottom surface of the sealing resin.

According to yet another implantation of the first aspect, the light-emitting element is mounted on the light-emitting element mounting backboard at a position closer to a bottom surface than to a top surface of the sealing resin.

According to yet another implantation of the first aspect, a diffusion plate over the first and second light emitting device; a diffusion sheet between the diffusion plate and an optical sheet.

According to yet another implantation of the first aspect, the first and second light emitting devices includes a light emitting diode (LED).

According to yet another implantation of the first aspect, the first and second electrodes of the first light emitting device are offset from the first and second electrodes of the second light emitting device in the first and second directions parallel to the plane of the mounting substrate.

According to yet another implantation of the first aspect, the first and second electrodes of the first light emitting device are offset from the first and second electrodes of the second light emitting device in the first and second directions parallel to the plane of the mounting substrate.

In a second aspect of the present disclosure, a liquid crystal display device comprises the lighting device of the first aspect.

In one implantation of the second aspect, a plurality of the lighting devices is divided into virtual targets in one or more regions; and the LCD device is configured to control an emission intensity of the plurality of the light emitting devices for each of the one or more regions based on a display image.

BRIEF DESCRIPTION OF THE DRAWINGS

Aspects of the exemplary disclosure are best understood from the following detailed description when read with the accompanying figures. Various features are not drawn to scale, dimensions of various features may be arbitrarily increased or reduced for clarity of discussion.

FIG. 3A shows a top plan view of an example mounting substrate having two pairs of conductive pads for receiving a pair of light emitting devices, according to the first implementation of the present disclosure.

FIG. 3B shows a top plan view of a first example light emitting device having its electrodes coupled to the first pair of conductive pads on the mounting substrate in FIG. 3A, according to the first implementation of the present disclosure.

FIG. 3C shows a top plan view of a second example light emitting device having its electrodes coupled to the second pair of conductive pads on the mounting substrate in FIG. 3B, according to the first implementation of the present disclosure.

FIG. 3D is a schematic circuit diagram showing the first and second light emitting devices and their corresponding electrical connections through the first and second pairs of conductive pads in FIG. 3C, according to the first implementation of the present disclosure.

FIG. 10A shows a top plan view of an example mounting substrate having two pairs of conductive pads for receiving a pair of light emitting devices, according to the third implementation of the present disclosure.

FIG. 10B shows a top plan view of a first light emitting device having its electrodes coupled to the first pair of conductive pads on the mounting substrate in FIG. 10A, according to the third implementation of the present disclosure.

FIG. 10C shows a top plan view of a second light emitting device having its electrodes coupled to the second pair of conductive pads on the mounting substrate in FIG. 10B, according to the third implementation of the present disclosure.

FIG. 10D is a schematic circuit diagram showing the first and second light emitting devices and their corresponding electrical connections through the first and second pairs of conductive pads in FIG. 10C, according to the third implementation of the present disclosure.

FIG. 12 is a schematic diagram of a portion of a lighting device having a plurality of side-emitting light device pairs, according to various implementations of the present disclosure.

DETAILED DESCRIPTION

Implementations of the present disclosure include various electrode and conductive pad arrangements to minimize or substantially eliminate non-emission regions of a lighting device.

A three-dimensional cartesian coordinate system is used in the description of various implementations and figures in the present disclosure. Two directions parallel to the major surface of a mounting substrate for mounting light emitting devices and orthogonal to each other are referred to as an x-direction and a y-direction. The direction orthogonal to both the x- and y-directions is referred to as a z-direction.

Figure 1A:
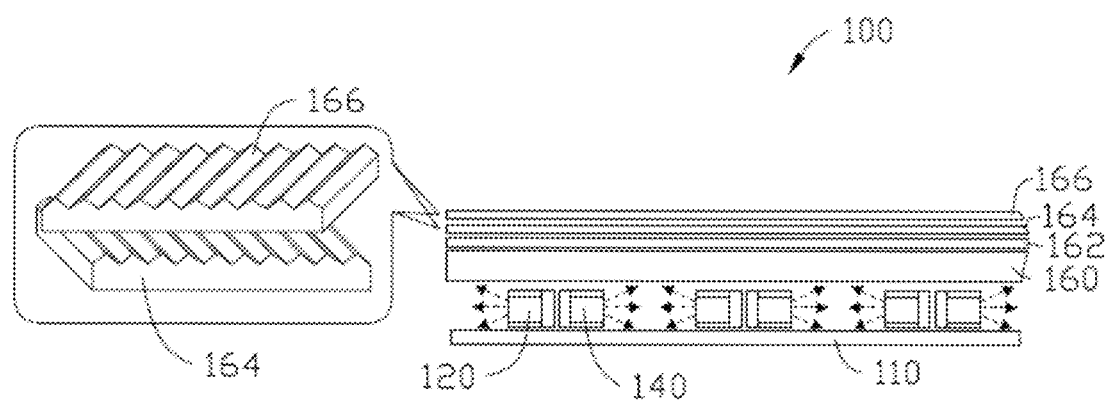
FIG. 1A shows a cross sectional view of a portion of an example lighting device, according to a first implementation of the present disclosure.

FIG. 1A shows a cross sectional view of a portion of an example lighting device, according to a first implementation of the present disclosure. In FIG. 1A, lighting device 100 may include mounting substrate 110, at least one pair of side-emitting light devices (e.g., first light emitting device 120 and second light emitting device 140), diffusion plate 160, diffusion sheet 162, and optical sheets 164 and 166, for example. It should be understood that lighting device 100 may include other layers and components not explicitly shown in FIG. 1A.

As shown in FIG. 1A, multiple pairs of light emitting devices are mounted on mounting substrate 110. Diffusion plate 160 is disposed over the light emitting devices and mounting substrate 110. Diffusion sheet 162 is disposed over diffusion plate 160. Optical sheets 164 and 166 are disposed over diffusion sheet 162. It should be understood that, in other implementations, mounting substrate 110, the multiple pairs of light emitting devices, diffusion plate 160, diffusion sheet 162, and optical sheets 164 and 166 are not limited to being arranged in the particular order shown in FIG. 1A.

In the first implementation, the light emitting device pairs are mounted on conductive pads (not explicitly shown in FIG. 1A) of mounting substrate 110. Each pair of the light emitting devices, such as light emitting devices 120 and 140, includes side-emitting light devices facing away from each other and capable of emitting lights toward various directions opposite of each other as indicated by the arrows. As the main direction of emission from light emitting devices 120 and 140 is along the x-y plane (shown in FIG. 1B) substantially parallel to the backlight surface, a thin backlight device/unit can be realized in the present implementation.

Figure 1B:
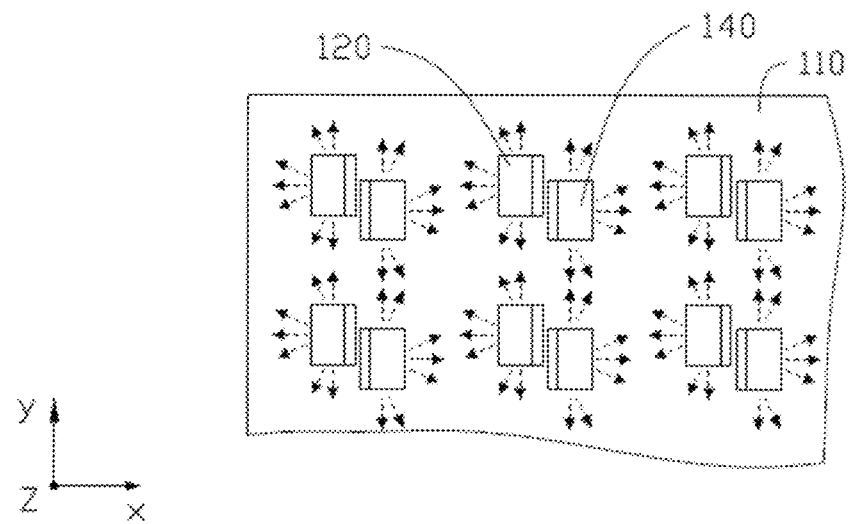
FIG. 1B shows a top plan view of a portion of the example lighting device of FIG. 1A, according to the first implementation of the present disclosure.

FIG. 1B shows a top plan view of a portion of the example lighting device of FIG. 1A, according to the first implementation of the present disclosure. In FIG. 1B, a plurality of light emitting device pairs is disposed on mounting substrate 110. For example, first light emitting device 120 and second light emitting device 140 as a pair of light emitting devices, among others, are disposed on mounting substrate 110. In particular, first light emitting device 120 and second light emitting device 140 are partially aligned with each other along the x-direction, and are offset from each other in both the x- and y-directions. In addition, first light emitting device 120 and second light emitting device 140 are mounted on their corresponding conductive pads (not explicitly shown in FIG. 1B) of mounting substrate 110. The first pair of conductive pads for first light emitting device 120 and the second pair of conductive pads for second light emitting device 140 are disposed on mounting substrate 110, and extend along the y-direction (e.g., as shown in FIG. 3A). The arrangement of the light emitting device pairs on mounting substrate 110 allows each pair of light emitting devices to be arranged in close proximity to each other, thereby substantially eliminating the dark spots that would otherwise have been resulted if the pairs of light emitting devices were arranged on conductive pads without an offset. As shown in FIG. 1B, each pair of the light emitting devices includes two light emitting devices having their backs against each other. For example, first light emitting device 120 and second light emitting device 140 together as a pair emit lights in all directions (e.g., 360 degrees) in the x-y plane, where first light emitting device 120 and second light emitting device 140 emit lights in various directions opposite of each other (e.g., each covering 180 degrees) as indicated by the arrows. In addition, as shown in FIG. 1A, first light emitting device 120 and second light emitting device 140 may also emit lights in various directions along the z-axis.

Figure 2A:
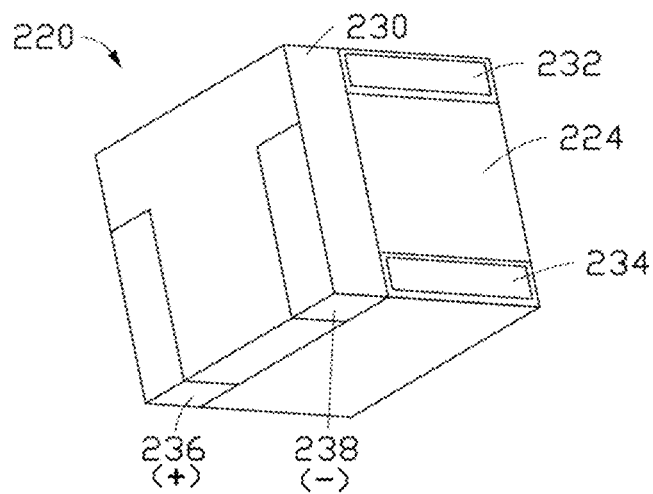
FIG. 2A shows a perspective view of an example light emitting device, according to the first implementation of the present disclosure.

FIG. 2A shows a perspective view of an example light emitting device, according to the first implementation of the present disclosure. In one implementation, light emitting device 220 may correspond to light emitting device 120 or 140 in FIGS. 1A and 1B.

As shown in FIG. 2A, light emitting device 220 (e.g., a side-emitting light device) may include sealing resin 224, light-emitting element mounting backboard 230, top reflector 232, bottom reflector 234, and electrodes 236 and 238. Sealing resin 224 seals a light-emitting element (not explicitly shown in FIG. 2A) in light emitting device 220. Sealing resin 224 may include, but is not limited to, phosphor, for example. Top reflector 232 is arranged on a top surface of sealing resin 224, and bottom reflector 234 is arranged on a bottom surface of sealing resin 224. Top reflector 232 and bottom reflector 234 may each include a white resin. Electrodes 236 and 238 are arranged at two ends of light-emitting element mounting backboard 230, and extend to a bottom surface of light emitting device 220. For example, electrode 236 and electrode 238 may respectively be an anode and a cathode of light emitting device 220 for electrical connections with conductive pads on a mounting substrate (e.g., mounting substrate 110 in FIGS. 1A and 1B).

Figure 2B:
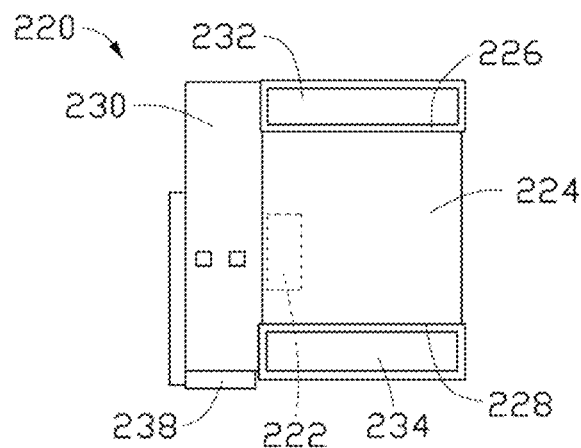
FIG. 2B shows a side view of the example light emitting device in FIG. 2A, according to the first implementation of the present disclosure.

FIG. 2B shows a side view of the example light emitting device in FIG. 2A, according to the first implementation of the present disclosure. As shown in the side view, light emitting device 220 may include light-emitting element mounting backboard 230, light-emitting element 222 embedded in sealing resin 224, top reflector 232 disposed on top surface 226 of sealing resin 224, and bottom reflector 234 disposed on bottom surface 228 of sealing resin 224.

Light-emitting element 222 is disposed on light-emitting element mounting backboard 230. In one implementation, light-emitting element 222 may include a light emitting diode, for example, capable of emitting blue light (e.g., with peak wavelength of 450 nm (i.e., 10^-9 meters)). As light-emitting element 222 is sealed in sealing resin 224 containing phosphor, light emitting device 220 may emit white light.

Figure 2C:
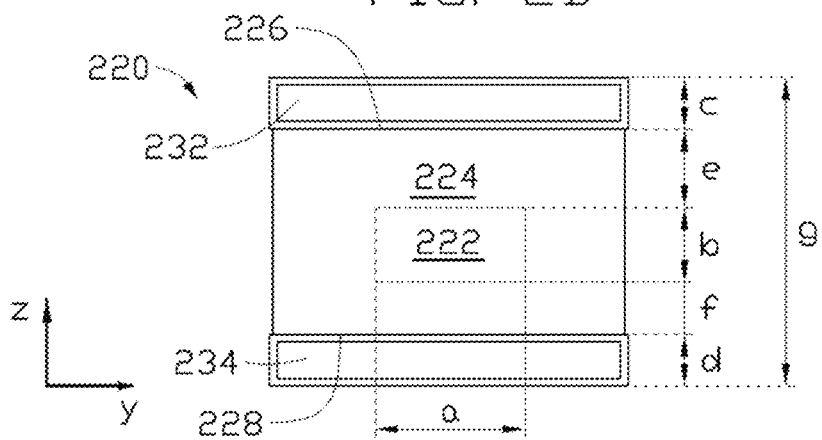
FIG. 2C shows a front view of the example light emitting device in FIG. 2A, according to the first implementation of the present disclosure.

FIG. 2C shows a front view of the example light emitting device in FIG. 2A, according to the first implementation of the present disclosure. As shown in the front view, light emitting device 220 may include light-emitting element 222 embedded in sealing resin 224, top reflector 232 disposed on top surface 226 of sealing resin 224, and bottom reflector 234 disposed on bottom surface 228 of sealing resin 224.

In one implementation, light-emitting element 222 may have a width of dimension a (e.g., 0.23 mm) and a height of dimension b (e.g., 0.13 mm). Top reflector 232 may have a thickness of dimension c (e.g., 0.1 mm). Bottom reflector 234 may have a thickness of dimension d (e.g., 0.1 mm). The distance between top surface 226 of sealing resin 224 and a top surface of light-emitting element 222 may be have dimension e (e.g., 0.17 mm). The distance between a bottom surface of light-emitting element 222 and bottom surface 228 of sealing resin 224 may have dimension f (e.g., 0.1 mm). Light emitting device 220 may have a height of dimension g (e.g., 0.6 mm). As such, light-emitting element 222 is disposed closer to bottom surface 228 of sealing resin 224 than to top surface 226 of sealing resin 224.

In one implementation, top reflector 232 and bottom reflector 234 may be formed by white resin, and together with light-emitting element 222 form three sides for emitting lights substantially parallel in the x-y plane along the z-direction. In one implementation, bottom reflector 234 may prevent absorption of light emission into the mounting substrate (e.g., conductive pads formed thereon) from light-emitting element 222.

In various implantations of the present disclosure, the mounting substrate, for mounting the light emitting devices and copper foil for circuit formation, is patterned, and a white solder resist is applied thereon. The reflectance of white light is, about 50% with copper foil, about 80% with the white solder resist on the copper foil, about 90% in the white solder resist on the substrate, and about 95% or more in a reflective sheet used on a bottom surface of a backlight. In the copper foil region (e.g., including the conductive pads) on the mounting substrate for mounting the light emitting devices, the reflectance is very low.

In the present implementation, top reflector 232 may prevent the formation of a local light point (hot spot) due to direct emission of light from light emitting device 220 to the lighting device. Since each light emitting device includes, for example, three light emitting and/or reflecting surfaces, when arranging two side-emitting light devices as a pair, the pair of side-emitting light devices emits light in all directions in the x-y plane substantially parallel to the lighting device's surface along the z-direction. Thus, the luminance distribution uniformity of the lighting device can be improved. Further, placing the light-emitting element 222 closer to bottom surface 228 of sealing resin 224 can reduce the amount of light leaked from top reflector 232. Thus, occurrences of the local hot spot due to light emitting device 220 can be reduced in the lighting device.

FIG. 3A shows a top plan view of an example mounting substrate having two pairs of conductive pads for receiving a pair of light emitting devices, according to the first implementation of the present disclosure. In FIG. 3A, a first pair of conductive pads 312 (e.g., a cathode) and 316 (e.g., an anode) and a second pair of conductive pads 314 (e.g., an anode) and 318 (e.g., a cathode) are arranged on a major surface of mounting substrate 310. The first pair of conductive pads 312 and 316 and the second pair of conductive pads 314 and 318 are arranged along the y-direction, and are offset from each other in both the x- and y-directions with respect to a plane parallel to mounting substrate 310. For example, conductive pads 312, 314, 316, and 318 are disposed on mounting substrate 310 in alternately offset positions. In addition, the first pair of conductive pads 312 and 316 overlaps with the second pair of conductive pads 314 and 318 along the x-direction in overlapping region 350, as shown in FIG. 3A.

In one implementation, each of conductive pads 312, 314, 316, and 318 has a width of dimension a (e.g., 0.2 mm) and a length of dimension b 0.25 mm). The minimum separation between each two adjacent conductive pads is shown as having dimension l, n, or p (e.g., 0.15 mm), for example, in the y-direction (as shown in FIG. 3C) based on the minimum design rules. The first pair of conductive pads 312 and 316 is offset in the x-direction from the second pair of conductive pads 314 and 318 by a distance having dimension c (e.g., 0.1 mm), for example. The first pair of conductive pads 312 and 316 is also offset in the y-direction from the second pair of conductive pads 314 and 318 by a distance represented by, for example, the sum of dimension k (e.g., 0.2 mm) and dimension l 0.15 mm). In addition, the first pair of conductive pads 312 and 316 and the second pair of conductive pads 314 and 318 also overlap with each other by a distance represented by the difference of dimension b (e.g., 0.25 mm) and dimension c 0.1 mm) in the x-direction in overlapping region 350. By having the offsets in the x- and y-directions as well as overlapping region 350, two light emitting devices (e.g., side-emitting LEDs) can be mounted in close proximity of each other as shown in FIGS. 3B and 3C. For example, as shown in FIG. 3C, a gap between first light emitting device 320 and second light emitting device 340 may have dimension j 0.1 mm).

FIG. 3B shows a top plan view of a first example light emitting device having its electrodes coupled to the first pair of conductive pads on the mounting substrate in FIG. 3A, according to the first implementation of the present disclosure. In FIG. 3B, first light emitting device 320 includes electrode 336 coupled to conductive pad 316 (e.g., an anode), and electrode 338 coupled to conductive pad 312 (e.g., a cathode) on mounting substrate 310 (not explicitly shown in FIG. 3B, but shown in FIG. 3A).

In one implementation, first light emitting device 320 may have a width of dimension d (e.g., 0.85 mm) and a length of the sum of dimension e (e.g., 0.6 mm) and dimension f (e.g., 0.1 mm). Electrode 336 may have a width of dimension g (e.g., 0.15 mm). Electrode 338 may have a width of dimension h (e.g., 0.15 mm). Electrodes 336 and 338 are separated from each other by a distance having dimension i (e.g., 0.55 mm). The second pair of conductive pads 314 and 318 is offset from the first pair of conductive pads 312 and 316 by a distance having dimension f 0.1 mm) in the x-direction.

FIG. 3C shows a top plan view of a second example light emitting device having its electrodes coupled to the second pair of conductive pads on the mounting substrate in FIG. 3B, according to the first implementation of the present disclosure. In FIG. 3C, first light emitting device 320 includes electrode 336 coupled to conductive pad 316 (e.g., an anode), and electrode 338 coupled to conductive pad 312 (e.g., a cathode) on mounting substrate 310 (not explicitly shown in FIG. 3C, but shown in FIG. 3A). In addition, second light emitting device 340 includes electrode 358 coupled to conductive pad 318 (e.g., a cathode), and electrode 356 coupled to conductive pad 314 (e.g., an anode) on mounting substrate 310. The center line of first light emitting device 320 and the center line of the second light emitting device 340 are offset from each other along the x-direction, for example.

In FIG. 3C, the minimum separation between each two adjacent conductive pads is represented by a distance of dimension l, n, or p (e.g., 0.15 mm), for example, in the y-direction based on the minimum design rules. Each conductive pad has a width of dimension k, m, o, or q (e.g., 0.2 mm) in the y-direction. In the first implementation, first light emitting device 320 and second light emitting device 340 are mounted on mounting substrate 310 with an offset by a distance represented by the sum of dimension p (e.g., 0.15 mm) and dimension q (e.g., 0.2 mm) in the y-direction. As shown in FIG. 3C, the separation between first light emitting device 320 and second light emitting device 340 is represented by the distance having dimension j (e.g., 0.1 mm), thereby minimizing and substantially eliminating a non-emission region (i.e., a dark spot) that would otherwise have been resulted if light emitting devices were to be arranged on their respective conductive pads in a convention manner on a mounting substrate without offsets and an overlapping region. Thus, the uniformity of luminance distribution of the backlight is improved.

FIG. 3D is a schematic circuit diagram showing the first and second light emitting devices and their corresponding electrical connections through the first and second pairs of conductive pads in FIG. 3C, according to the first implementation of the present disclosure. In FIG. 3D, the cathode of first light emitting device 320 is connected to a first driver (e.g., an LED driver). The cathode electrode of second light emitting device 340 is connected to a second driver (e.g., an LED driver). The anode of each of first light emitting device 320 and second light emitting device 340 is connected to a node, Vf. As such, first light emitting device 320 and second light emitting device 340 can be controlled independently by their respective drivers. Thus, the emission state of each corresponding light emitting device can be individually controlled. As a result, in a liquid crystal display that combines a backlight and a liquid crystal panel according to implementations of the present disclosure, local dimming drive can be achieved to control the luminance distribution of the backlight in accordance with the display image.

Figure 4A:
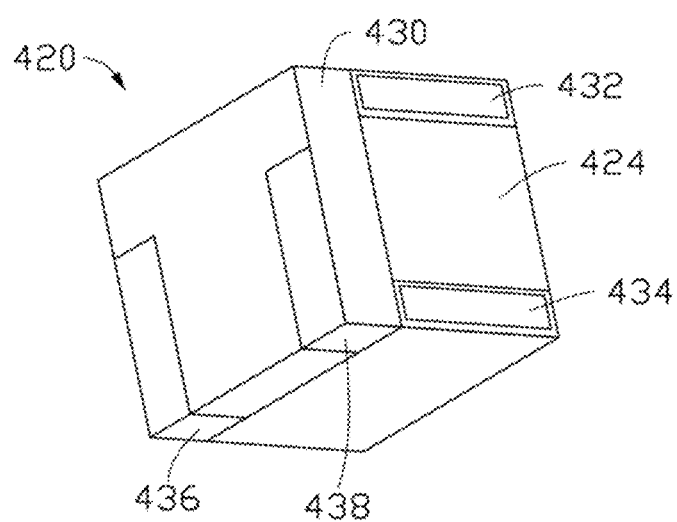
FIG. 4A shows a perspective view of a comparative example light emitting device.

FIG. 4A shows a perspective view of a comparative example light emitting device. In FIG. 4A, light emitting device 420 may substantially correspond to light emitting device 220 in FIG. 2A, and includes sealing resin 424, light-emitting element mounting backboard 430, top reflector 432, bottom reflector 434, electrodes 436 and 438.

Figure 4B:
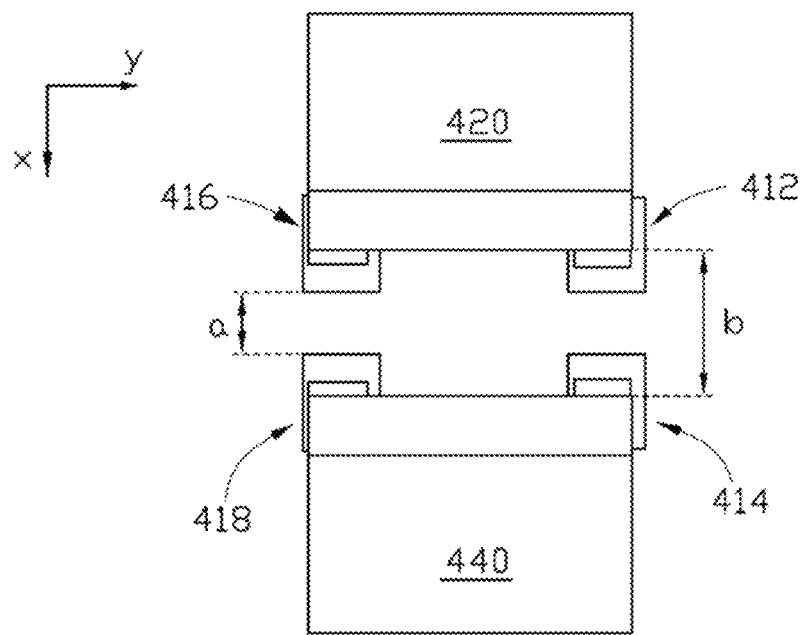
FIG. 4B shows a pair of the comparative example light emitting devices in FIG. 4A having their electrodes coupled to land patterns without any offset.

FIG. 4B shows a pair of the comparative example light emitting devices in FIG. 4A having their electrodes coupled to land patterns without any offset. In FIG. 4B, light emitting device 420 is coupled to a first pair of conductive pads 412 and 416, and light emitting device 440 is coupled to a second pair of conductive pads 414 and 418. As shown in FIG. 4B, the first pair of conductive pads 412 and 416 and the second pair of conductive pads 414 and 418 are aligned with each other in both the x- and y-directions without any offset, in contrast to the light emitting devices of the first implementation of the present disclosure as shown in FIG. 3C. As a result, the first pair of conductive pads 412 and 416 is separated from the second pair of conductive pads 414 and 418 by dimension a (e.g., 0.15 mm) required by the design rules. Moreover, light emitting devices 420 and 440 are separated by dimension b (e.g., 0.4 mm) in the x-direction. Thus, as shown in the comparative example in FIG. 4B, the pair of light emitting devices 420 and 440 cannot be arranged in close proximity on a mounting substrate as each electrode of light emitting devices 420 and 440 needs to have enough space around it to prevent short circuit to another electrode.

As shown in FIG. 4B, the minimum gap between light emitting devices 420 and 440 has dimension b (e.g., 0.4 mm) whereas the gap shown in FIG. 3C according to the first implementation of the present disclosure is only dimension j (e.g., 0.1 mm). The large non-emission region between the light emitting devices in FIG. 4B affects the uniformity of luminance distribution of the lighting (e.g., backlight) device.

Figure 5A:
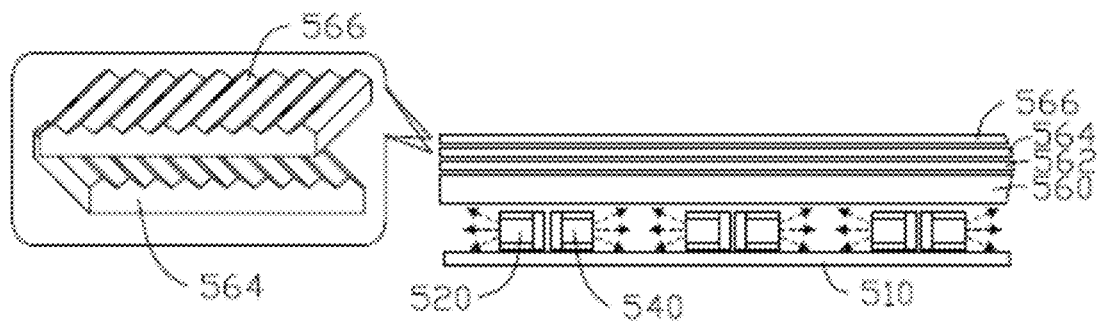
FIG. 5A shows a cross sectional view of a portion of an example lighting device, according to a second implementation of the present disclosure.

FIG. 5A shows a cross sectional view of a portion of an example lighting device, according to a second implementation of the present disclosure. In FIG. 5A, lighting device 500 may include mounting substrate 510, at least one pair of light emitting devices (e.g., first light emitting device 520 and second light emitting device 540), diffusion plate 560, diffusion sheet 562, and optical sheets 564 and 566, for example. It should be understood that lighting device 500 may include other layers and components not explicitly shown in FIG. 5A.

As shown in FIG. 5A, multiple pairs of light emitting devices are mounted on mounting substrate 510. Diffusion plate 560 is disposed over the light emitting devices and mounting substrate 510. Diffusion sheet 562 is disposed over diffusion plate 560. Optical sheets 564 and 566 are disposed over diffusion sheet 562. It should be understood that, in other implementations, mounting substrate 510, the multiple pairs of light emitting devices, diffusion plate 560, diffusion sheet 562, and optical sheets 564 and 566 are not limited to being arranged in the particular order shown in FIG. 5A.

In the second implementation, the light emitting device pairs are mounted on conductive pads (not explicitly shown in FIG. 5A) of mounting substrate 510. Each pair of the light emitting devices, such as light emitting devices 520 and 540, includes side-emitting light devices facing away from each other and capable of emitting lights toward various directions opposite of each other as indicated by the arrows. As the main direction of emission from light emitting devices 520 and 540 is along the x-y plane (shown in FIG. 5B) substantially parallel to the backlight surface, a thin backlight device/unit can be realized in the present implementation.

Figure 5B:
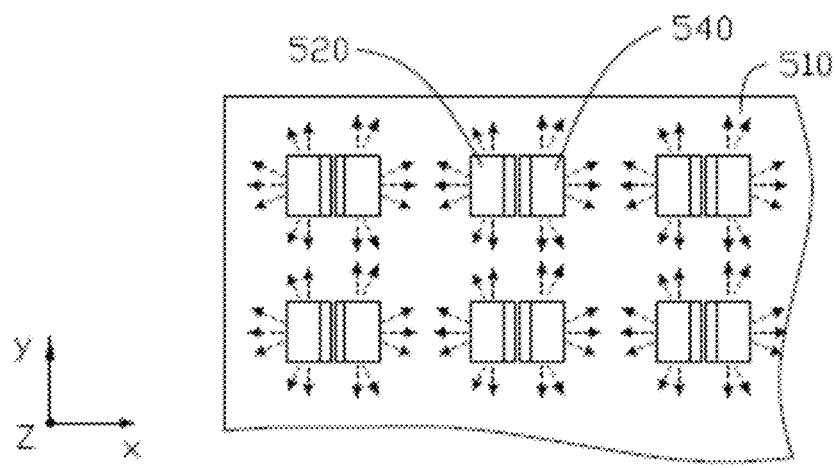
FIG. 5B shows a top plan view of a portion of the example lighting device of FIG. 5A, according to the second implementation of the present disclosure.
Figure 7A:
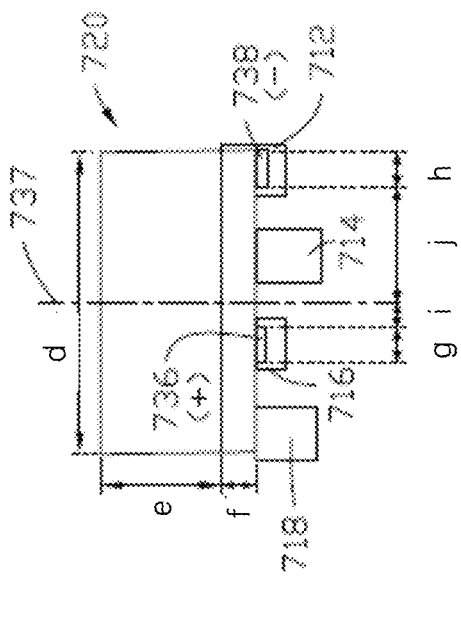
FIG. 7A shows a top plan view of an example mounting substrate having two pairs of conductive pads for receiving a pair of light emitting devices, according to the second implementation of the present disclosure.

FIG. 5B shows a top plan view of a portion of the example lighting device of FIG. 5A, according to the second implementation of the present disclosure. In FIG. 5B, a plurality of light emitting devices are mounted on mounting substrate 510. For example, first light emitting device 520 and second light emitting device 540 as a pair of light emitting devices, among others, are disposed on mounting substrate 510. As shown in FIG. 5B, although first light emitting device 520 and second light emitting device 540 are aligned with each other (e.g., in the y-direction), the conductive pads (not explicitly shown in FIG. 5B) for receiving first light emitting device 520 and second light emitting device 540 on mounting substrate 510 are offset from each other (as shown in FIG. 7A). The arrangement of the light emitting device pairs on mounting substrate 510 allows each pair of light emitting devices to be arranged in close proximity to each other, thereby substantially eliminating the dark spots that would otherwise have been resulted if the pairs of light emitting devices were arranged on conductive pads without an offset. As shown in FIG. 5B, each pair of the light emitting devices includes two light emitting devices having their backs against each other. For example, first light emitting device 520 and second light emitting device 540 together as a pair emit lights in all directions (e.g., 360 degrees) in the x-y plane, where first light emitting device 520 and second light emitting device 540 emit lights in various directions opposite of each other each covering 180 degrees) as indicated by the arrows. In addition, as shown in FIG. 5A, first light emitting device 520 and second light emitting device 540 may also emit lights in various directions along the z-axis.

Figure 6A:
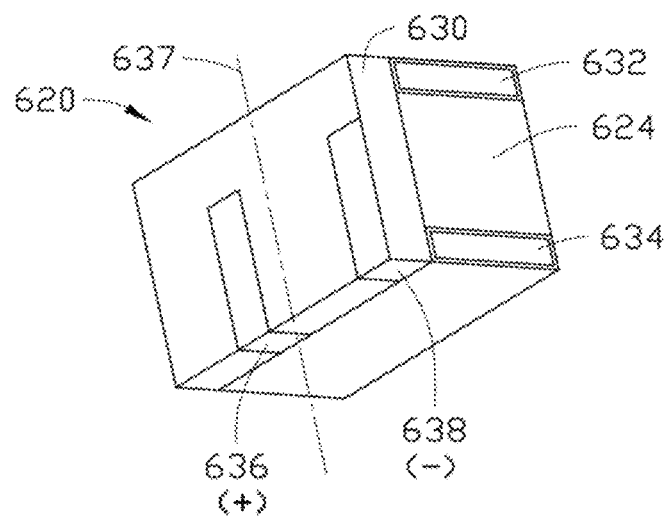
FIG. 6A shows a perspective view of an example light emitting device, according to the second implementation of the present disclosure.

FIG. 6A shows a perspective view of an example light emitting device, according to the second implementation of the present disclosure. In one implementation, light emitting device 620 may correspond to light emitting device 520 or 540 in FIGS. 5A and 5B.

As shown in FIG. 6A, light emitting device 620 (e.g., a side-emitting light device) may include sealing resin 624, light-emitting element mounting backboard 630, top reflector 632, bottom reflector 634, and electrodes 636 and 638. Sealing resin 624 seals a light-emitting element (not explicitly shown in FIG. 6A) in light emitting device 620. Sealing resin 624 may include, but is not limited to, phosphor, for example. Top reflector 632 is arranged on a top surface of sealing resin 624, and bottom reflector 634 is arranged on a bottom surface of sealing resin 624. Top reflector 632 and bottom reflector 634 may each include a white resin. In the present implementation, electrodes 636 and 638 are arranged asymmetrically along center line 637 of light-emitting element mounting backboard 630. For example, electrode 636 is arranged closer to center line 637, while electrode 638 is arranged farther from center line 637 and at one end of light-emitting element mounting backboard 630. Electrodes 636 and 638 extend to a bottom surface of light emitting device 620. For example, electrode 636 and electrode 638 may respectively be an anode and a cathode of light emitting device 620 for electrical connections with conductive pads on a mounting substrate (e.g., mounting substrate 510 in FIGS. 5A and 5B).

Figure 6B:
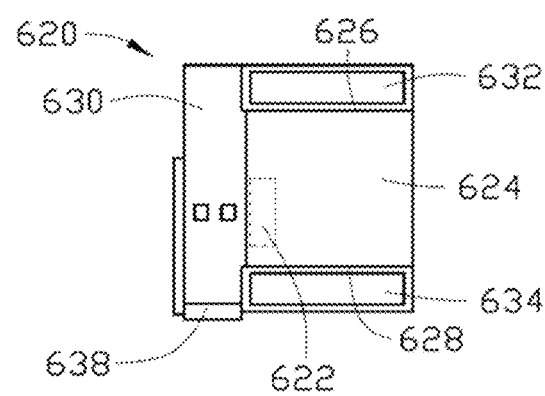
FIG. 6B shows a side view of the example light emitting device in FIG. 6A, according to the second implementation of the present disclosure.

FIG. 6B shows a side view of the example light emitting device in FIG. 6A, according to the second implementation of the present disclosure. As shown in the side view, light emitting device 620 may include light-emitting element mounting backboard 630, light-emitting element 622 embedded in sealing resin 624, top reflector 632 disposed on top surface 626 of sealing resin 624, and bottom reflector 634 disposed on bottom surface 628 of sealing resin 624.

Light-emitting element 622 is disposed on light-emitting element mounting backboard 630. In one implementation, light-emitting element 622 may include a light emitting diode, for example, capable of emitting blue light (e.g., with peak wavelength of 450 nm). As light-emitting element 622 is sealed in sealing resin 624 containing phosphor, light emitting device 620 may emit white light.

Figure 6C:
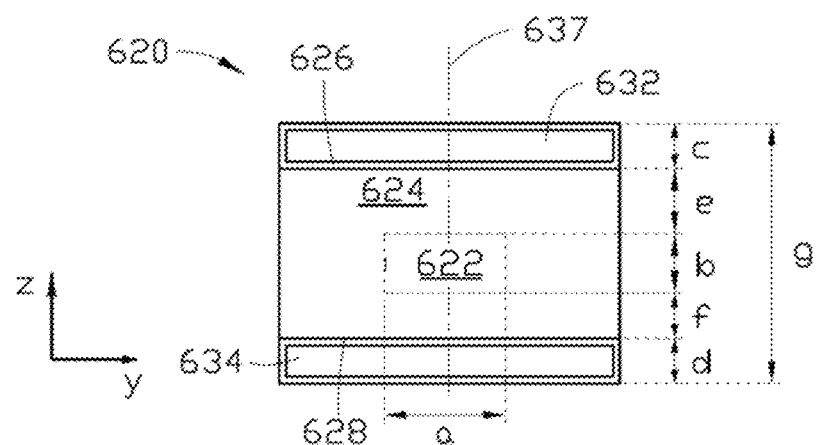
FIG. 6C shows a front view of the example light emitting device in FIG. 6A, according to the second implementation of the present disclosure.

FIG. 6C shows a front view of the example light emitting device in FIG. 6A, according to the second implementation of the present disclosure. As shown in the front view, light emitting device 620 may include light-emitting element 622 embedded in sealing resin 624, top reflector 632 disposed on top surface 626 of sealing resin 624, bottom reflector 634 disposed on bottom surface 628 of sealing resin 624.

In one implementation, light-emitting element 622 may have a width of dimension a (e.g., 0.23 mm) and a height of dimension b (e.g., 0.13 mm). Top reflector 632 may have a thickness of dimension c (e.g., 0.1 mm). Bottom reflector 634 may have a thickness of dimension d (e.g., 0.1 mm). The distance between top surface 626 of sealing resin 624 and a top surface of light-emitting element 622 may be have dimension e (e.g., 0.17 mm). The distance between a bottom surface of light-emitting element 622 and bottom surface 628 of sealing resin 624 may have dimension f (e.g., 0.1 mm). Light emitting device 620 may have a height of dimension g (e.g., 0.6 mm). As such, light-emitting element 622 is disposed closer to bottom surface 628 of sealing resin 624 than to top surface 626 of sealing resin 624.

In one implementation, top reflector 632 and bottom reflector 634 may be formed by white resin, and together with light-emitting element 622 form three sides for emitting lights substantially parallel in the x-y plane along the z-direction. In one implementation, bottom reflector 634 may prevent absorption of light emission into the mounting substrate (e.g., conductive pads formed thereon) from light-emitting element 622. The materials used for various elements of light emitting device 620 may be substantially similar to those of light emitting device 220 in FIGS. 2A-2C, the details of which are omitted for brevity.

In the present implementation, top reflector 632 may prevent the formation of a local light point (hot spot) due to direct emission of light from light emitting device 620 to the lighting device. Since each light emitting device includes, for example, three light emitting and/or reflecting surfaces, when arranging two side-emitting light devices as a pair, the pair of light emitting devices emits light in all directions in the x-y plane substantially parallel to the lighting device's surface. Thus, the luminance distribution uniformity of the lighting device can be improved. Further, placing the light-emitting element 622 closer to bottom surface 628 of sealing resin 624 can reduce the amount of light leaked from top reflector 632. Thus, occurrences of the local hot spot due to light emitting device 620 can also be reduced in the lighting device.

FIG. 7A shows a top plan view of an example mounting substrate having two pairs of conductive pads for receiving a pair of light emitting devices, according to the second implementation of the present disclosure. In FIG. 7A, a first pair of conductive pads 712 (e.g., a cathode) and 716 (e.g., an anode) and a second pair of conductive pads 714 (e.g., an anode) and 718 (e.g., a cathode) are arranged on a major surface of mounting substrate 710. The first pair of conductive pads 712 and 716 and the second pair of conductive pads 714 and 718 are arranged along the y-direction, and are offset from each other in both the x- and y-directions with respect to a plane parallel to mounting substrate 710. For example, conductive pads 712, 714, 716, and 718 are disposed on mounting substrate 710 in alternately offset positions. In addition, the first pair of conductive pads 712 and 716 overlaps with the second pair of conductive pads 714 and 718 along the x-direction in overlapping region 750, as shown in FIG. 7A.

Figure 7B:
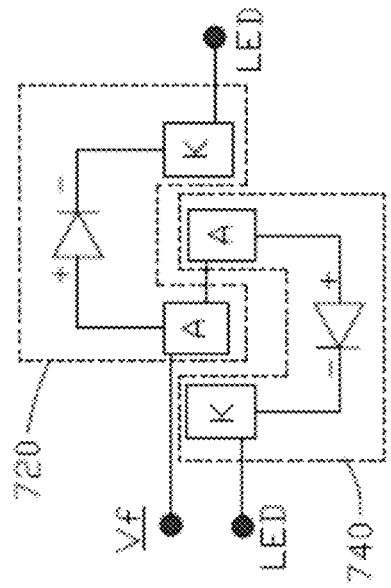
FIG. 7B shows a top plan view of a first light emitting device having its electrodes coupled to the first pair of conductive pads on the mounting substrate in FIG. 7A, according to the second implementation of the present disclosure.
Figure 7C:
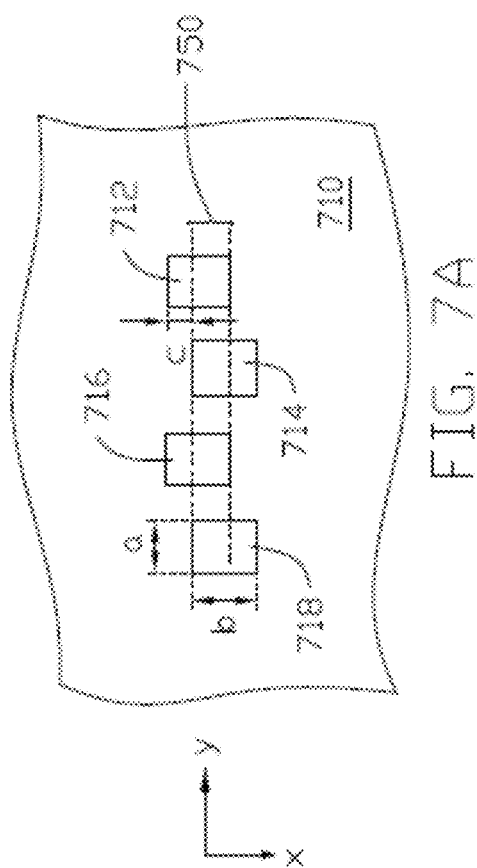
FIG. 7C shows a top plan view of a second light emitting device having its electrodes coupled to the second pair of conductive pads on the mounting substrate in FIG. 7B, according to the second implementation of the present disclosure.

In one implementation, each of conductive pads 712, 714, 716, and 718 has a width of dimension a (e.g., 0.2 mm) and a length of dimension b (e.g., 0.25 mm). The minimum separation between each two adjacent conductive pads is shown as having dimension l, n, or p (e.g., 0.15 mm), for example, in the y-direction (as shown in FIG. 7C) based on the minimum design rules. The first pair of conductive pads 712 and 716 is offset in the x-direction from the second pair of conductive pads 714 and 718 by a distance having dimension c (e.g., 0.1 mm), for example. The first pair of conductive pads 712 and 716 is also offset in the y-direction from the second pair of conductive pads 714 and 718, by a distance represented by, for example, the sum of dimension k (e.g., 0.2 mm) and dimension l 0.15 mm). In addition, the first pair of conductive pads 712 and 716 and the second pair of conductive pads 714 and 718 also overlap with each other by a distance represented by the difference of dimension b (e.g., 0.25 mm) and dimension c 0.1 mm) in the x-direction in overlapping region 750. By having the offsets in the x- and y-directions as well as overlapping region 750, two light emitting devices (e.g., side-emitting LEDs) can be mounted in close proximity of each other as shown in FIGS. 7B and 7C. For example, as shown in FIG. 7C, a gap between first light emitting device 720 and second light emitting device 740 may have dimension j 0.1 mm).

FIG. 7B shows a top plan view of a first example light emitting device having its electrodes coupled to the first pair of conductive pads on the mounting substrate in FIG. 7A, according to the second implementation of the present disclosure. In FIG. 7B, first light emitting device 720 includes electrode 736 coupled to conductive pad 716 (e.g., an anode), and electrode 738 coupled to conductive pad 712 (e.g., a cathode) on mounting substrate 710 (not explicitly shown in FIG. 7B, but shown in FIG. 7A).

In one implementation, first light emitting device 720 may have a width of dimension d (e.g., 1.2 mm) and a length of the sum of dimension e (e.g., 0.6 mm) and dimension f (e.g., 0.1 mm). Electrode 736 may have a width of dimension g (e.g., 0.15 mm). Electrode 738 may have a width of dimension h (e.g., 0.15 mm). Electrode 736 is spaced from center line 737 by dimension i (e.g., 0.1 mm), while electrode 738 is spaced from center line 737 by dimension j (e.g., 0.45 mm). Electrodes 736 and 738 are separated from each other by a distance of the sum of dimension i (e.g., 0.1 mm) and dimension j (e.g., 0.45 mm). The second pair of conductive pads 714 and 718 is offset from the first pair of conductive pads 712 and 716 by a distance having dimension f (e.g., 0.1 mm) in the x-direction.

FIG. 7C shows a top plan view of a second light emitting device having its electrodes coupled to the second pair of conductive pads on the mounting substrate in FIG. 7B, according to the second implementation of the present disclosure. In FIG. 7C, first light emitting device 720 includes electrode 736 coupled to conductive pad 716 (e.g., an anode), and electrode 738 coupled to conductive pad 712 (e.g., a cathode) on mounting substrate 710 (not explicitly shown in FIG. 7C, but shown in FIG. 7A). In addition, second light emitting device 740 includes electrode 758 coupled to conductive pad 718 (e.g., a cathode), and electrode 756 coupled to conductive pad 714 (e.g., an anode) on mounting substrate 710. The center line of first light emitting device 720 and the center line of second light emitting device 740 are aligned with each other along the x-direction, for example.

In FIG. 7C, the minimum separation between each two adjacent conductive pads is represented by a distance of dimension l, n, or p (e.g., 0.15 mm), for example, in the y-direction based on the minimum design rules. Each conductive pad has a width of dimension k, m, o, or q (e.g., 0.2 mm) in the y-direction. In the second implementation, first light emitting device 720 and second light emitting device 740 are mounted on mounting substrate 710 with no offset in the y-direction. As shown in FIG. 7C, the separation between first light emitting device 720 and second light emitting device 740 is represented by a distance having dimension r (e.g., 0.1 mm), thereby minimizing and substantially eliminating a non-emission region (i.e., a dark spot) that would otherwise have been resulted if light emitting devices were to be arranged on their respective conductive pads in a convention manner on a mounting substrate without offsets and an overlapping region. For example, in comparison to light emitting devices 420 and 440 shown in FIG. 4B having the minimum gap of 0.4 mm, the separation between first light emitting device 720 and second light emitting device 740 is 0.1 mm. As a result, by arranging the light emitting devices on the mounting substrate as shown in FIGS. 7A through 7D, the uniformity of luminance distribution of the backlight can be improved.

It should be noted that, in the second implementation, similar to the first implementation shown in FIG. 3A, the first pair of conductive pads 712 and 716 and the second pair of conductive pads 714 and 718 are arranged on mounting substrate 710 with offsets in both the x- and y-directions, and have overlapping region 750 along the x-direction. In the second implementation, as the electrodes (e.g., electrodes 636 and 638 in FIG. 6A) are disposed asymmetrically (e.g., with respect to center line 637 in FIG. 6A) on the light-emitting element mounting backboard, light emitting devices 720 and 740 are aligned with each other in the y-direction. As such, the optical axes of light emitting devices 720 and 740 are aligned without an offset (e.g., as shown in FIG. 5B).

Figure 7D:
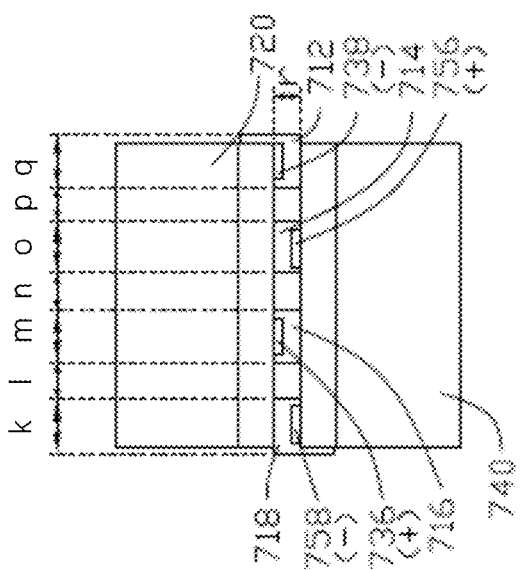
FIG. 7D is a schematic circuit diagram showing the first and second light emitting devices and their corresponding electrical connections through the first and second pairs of conductive pads in FIG. 7C, according to the second implementation of the present disclosure.

FIG. 7D is a schematic circuit diagram showing the first and second light emitting devices and their corresponding electrical connections through the first and second pairs of conductive pads in FIG. 7C, according to the second implementation of the present disclosure. In FIG. 7D, the cathode of first light emitting device 720 is connected to a first LED driver (e.g., an LED driver). The cathode of second light emitting device 740 is connected to a second LED driver (e.g., an LED driver). The anode electrode of each of first light emitting device 720 and second light emitting device 740 is connected to a node, Vf. As such, first light emitting device 720 and second light emitting device 740 can be controlled independently by their respective drivers. Thus, the emission state of each corresponding light emitting device can be individually controlled. As a result, in a liquid crystal display that combines a backlight and a liquid crystal panel according to implementations of the present disclosure, local dimming drive can be achieved to control the luminance distribution of the backlight in accordance with the display image.

Figure 8A:
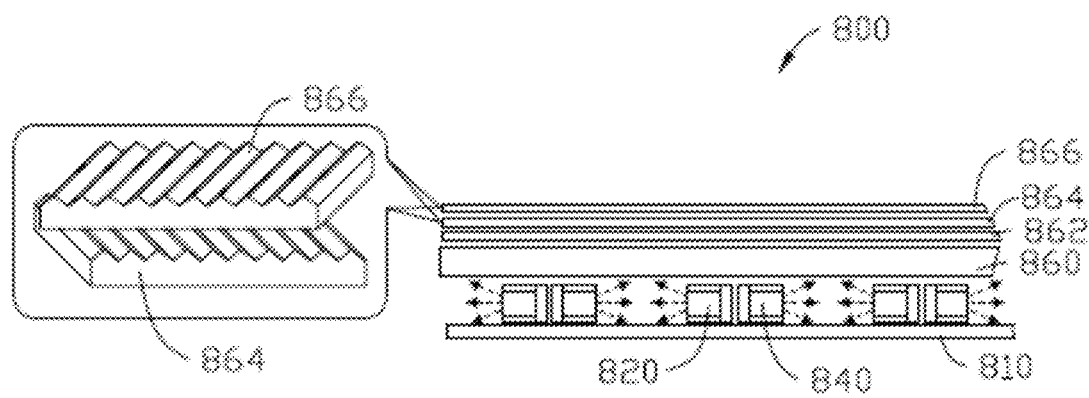
FIG. 8A shows a cross sectional view of a portion of an example lighting device, according to a third implementation of the present disclosure.

FIG. 8A shows a cross sectional view of a portion of an example lighting device, according to a third implementation of the present disclosure. In FIG. 8A, lighting device 800 may include mounting substrate 810, at least one pair of light emitting devices first light emitting device 820 and second light emitting device 840), diffusion plate 860, diffusion sheet 862, and optical sheets 864 and 866, for example. It should be understood that lighting device 800 may include other layers and components not explicitly shown in FIG. 8A.

As shown in FIG. 8A, multiple pairs of light emitting devices are mounted on mounting substrate 810. Diffusion plate 860 is disposed over the light emitting devices and mounting substrate 810. Diffusion sheet 862 is disposed over diffusion plate 860. Optical sheets 864 and 866 are disposed over diffusion sheet 862. It should be understood that, in other implementations, mounting substrate 810, the multiple pairs of light emitting devices, diffusion plate 860, diffusion sheet 862, and optical sheets 864 and 866 are not limited to being arranged in the particular order shown in FIG. 8A.

In the third implementation, the light emitting device pairs are mounted on conductive pads (not explicitly shown in FIG. 8A) of mounting substrate 810. Each pair of the light emitting devices, such as light emitting devices 820 and 840, includes side-emitting light devices facing away from each other and capable of emitting lights toward opposite directions opposite of each other as indicated by the arrows. As the main direction of emission from light emitting devices 820 and 840 is along the x-y plane (shown in FIG. 8B)

substantially parallel to the backlight surface, a thin backlight device/unit can be realized in the present implementation.

In one implementation, in addition to diffusion plate 860, diffusion sheet 862, and optical sheets 864 and 866, a wavelength conversion sheet and/or a prism sheet may be arranged as appropriate on the first and second light emitting devices 820 and 840, or diffusion sheet 862 may be replaced with a wavelength conversion sheet, to configure the lighting device. In one implementation, the wavelength conversion sheet is a sheet for receiving blue light and converting a portion of the blue light to green and red-light so that white light is obtained. Accordingly, when the wavelength conversion sheet is implemented, each pair of the light emitting devices, such as light emitting devices 820 and 840, may emit blue light. In one implementation, the wavelength conversion sheet is a sheet containing phosphor, a photoluminescence material, such as Quantum Dot (QD), and the like.

Figure 8B:
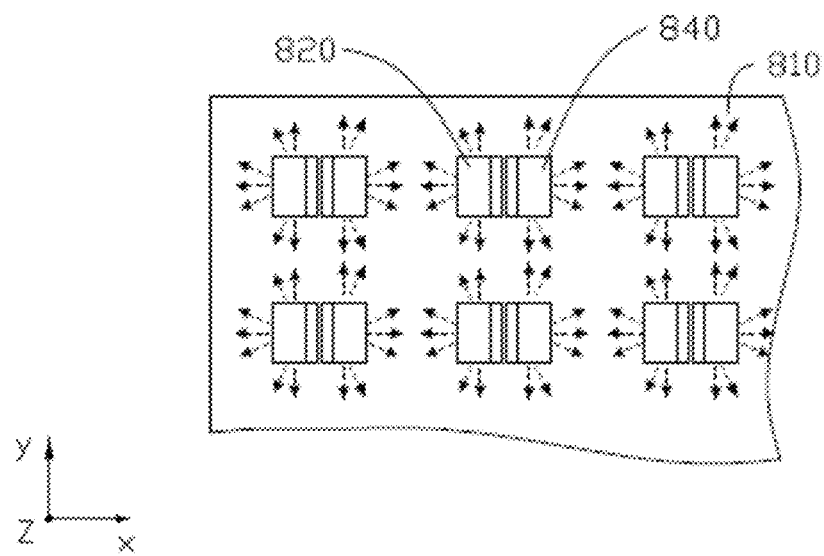
FIG. 8B shows a top plan view of a portion of the example lighting device of FIG. 8A, according to the third implementation of the present disclosure.

FIG. 8B shows a top plan view of a portion of the example lighting device of FIG. 8A, according to the third implementation of the present disclosure. In FIG. 8B, a plurality of light emitting devices are mounted on mounting substrate 810. For example, first light emitting device 820 and second light emitting device 840 as a pair of light emitting devices, among others, are disposed on mounting substrate 810. As shown in FIG. 8B, although first light emitting device 820 and second light emitting device 840 are aligned with each other (e.g., in the y-direction), the conductive pads (not explicitly shown in FIG. 8B) for receiving first light emitting device 820 and second light emitting device 840 on mounting substrate 810 are offset from each other (as shown in FIG. 10A). The arrangement of the light emitting device pairs on mounting substrate 810 allows each pair of light emitting devices to be arranged in close proximity to each other, thereby substantially eliminating the dark spots that would otherwise have been resulted if the pairs of light emitting devices arranged on conductive pads without an offset. As shown in FIG. 8B, each pair of the light emitting devices includes two light emitting devices having their backs against each other. For example, first light emitting device 820 and second light emitting device 840 together as a pair emit lights in all directions (e.g., 360 degrees) in the x-y plane, where first light emitting device 820 and second light emitting device 840 emit lights in various directions opposite of each other (e.g., each covering 180 degrees) as indicated by the arrows. In addition, as shown in FIG. 8A, first light emitting device 820 and second light emitting device 840 may also emit lights in various directions along the z-axis.

Figure 9A:
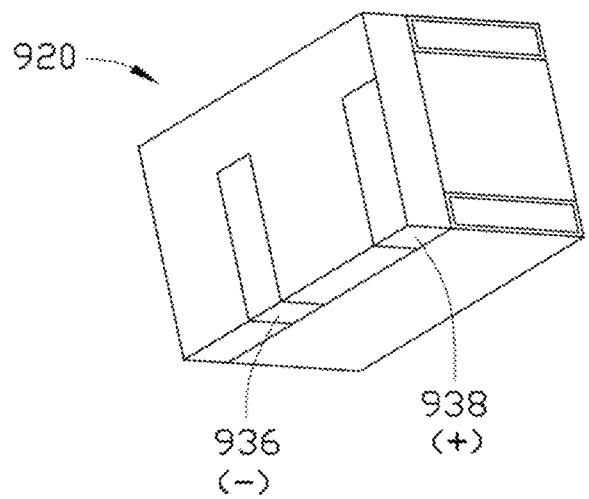
FIG. 9A shows a perspective view of an example light emitting device, according to the third implementation of the present disclosure.
Figure 9B:
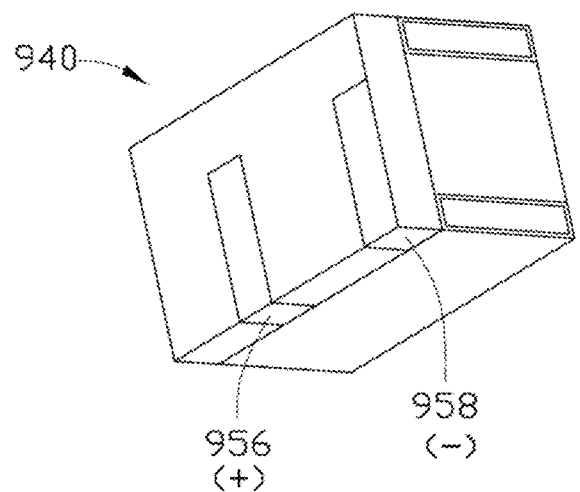
FIG. 9B shows a perspective view of another example light emitting device, according to the third implementation of the present disclosure.

FIGS. 9A and 9B each show a perspective view of an example light emitting device, according to the third implementation of the present disclosure. In FIG. 9A, light emitting device 920 may correspond to light emitting device 820 in FIGS. 8A and 8B. In FIG. 9B, light emitting device 940 may correspond to light emitting device 840 in FIGS. 8A and 8B.

In FIG. 9A, light emitting device 920 may be substantially similar to light emitting device 620 in FIGS. 6A-6C, except that electrode 938 is an anode and electrode 936 is a cathode. In FIG. 9B, light emitting device 940 may be substantially similar to light emitting device 620 in FIGS. 6A-6C, where electrode 956 (e.g., an anode) may correspond to electrode 636, and electrode 958 (e.g., a cathode) may correspond to electrode 638.

As the polarities of electrodes 956 and 958 of light emitting device 940 are opposite of the polarities of electrodes 936 and 938 of light emitting device 920, light emitting device 940 can be connected in series with light emitting device 920 by connecting electrodes 936 and 956 through conductive pads (e.g., conductive pads 1014 and 1016 in FIG. 10A) on a mounting substrate.

FIG. 10A shows a top plan view of an example mounting substrate having two pairs of conductive pads for receiving a pair of light emitting devices, according to the third implementation of the present disclosure. In FIG. 10A, a first pair of conductive pads 1012 (e.g., an anode) and 1016 (e.g., a cathode) and a second pair of conductive pads 1014 an anode) and 1018 (e.g., a cathode) are arranged on a major surface of mounting substrate 1010. The first pair of conductive pads 1012 and 1016 and the second pair of conductive pads 1014 and 1018 are arranged along the y-direction, and are offset from each other in both the x- and y-directions with respect to a plane parallel to mounting substrate 1010. For example, conductive pads 1012, 1014, 1016, and 1018 are disposed on mounting substrate 1010 in alternately offset positions. In addition, the first pair of conductive pads 1012 and 1016 overlaps with the second pair of conductive pads 1014 and 1018 along the x-direction in overlapping region 1050, as shown in FIG. 10A.

In one implementation, each of conductive pads 1012, 1014, 1016, and 1018 has a width dimension a (e.g., 0.2 mm) and a length of dimension b (e.g., 0.25 mm). The minimum separation between two adjacent conductive pads is shown as having dimension l or o (e.g., 0.15 mm), for example, in the y-direction (as shown in FIG. 10C) based on the minimum design rules. In the present implementation, because conductive pads 1014 and 1016 are electrically connected to each other, they may be treated as a single conductive pad that is spaced apart from conductive pads 1012 and 1018 thereby following the minimum design rules. The first pair of conductive pads 1012 and 1016 is offset in the x-direction from the second pair of conductive pads 1014 and 1018 by a distance having dimension c (e.g., 0.1 mm). The first pair of conductive pads 1012 and 1016 is also offset in the y-direction from the second pair of conductive pads 1014 and 1018, by a distance represented by, for example, the sum of dimension k (e.g., 0.2 mm) and dimension l (e.g., 0.15 mm). In addition, the first pair of conductive pads 1012 and 1016 and the second pair of conductive pads 1014 and 1018 also overlap with each other by a distance represented by the difference of dimension b (e.g., 0.25 mm) and dimension c (e.g., 0.1 mm) in the x-direction in overlapping region 1050. By having the offsets in the x- and y-directions as well as overlapping region 1050, two light emitting devices (e.g., side-emitting LEDs) can be mounted in close proximity of each other as shown in FIGS. 10B and 10C. For example, as shown in FIG. 10C, a gap between first light emitting device 1020 and second light emitting device 1040 may have dimension q (e.g., 0.1 mm).

FIG. 10B shows a top plan view of a first light emitting device having its electrodes coupled to the first pair of conductive pads on the mounting substrate in FIG. 10A, according to the third implementation of the present disclosure. In FIG. 10B, first light emitting device 1020 includes electrode 1036 coupled to conductive pad 1016 (e.g., a cathode), and electrode 1038 coupled to conductive pad 1012 (e.g., an anode) on mounting substrate 1010 (not explicitly shown in FIG. 10B, but shown in FIG. 10A).

In one implementation, first light emitting device 1020 may have a width of dimension d (e.g., 1.05 mm) and a length of the sum of dimension e (e.g., 0.6 mm) and dimension f (e.g., 0.1 mm). Electrode 1036 may have a width of dimension g (e.g., 0.15 mm). Electrode 1038 have a width of dimension h (e.g., 0.15 mm). Electrode 1036 is spaced from center line 1037 by dimension i (e.g., 0.025 mm), while electrode 1038 is spaced from center line 1037 by dimension j (e.g., 0.375 mm). Electrodes 1036 and 1038 are separated from each other by a distance of the sum of dimension i (e.g., 0.025 mm) and dimension j (e.g., 0.375 mm). The second pair of conductive pads 1014 and 1018 is offset from the first pair of conductive pads 1012 and 1016 by a distance having dimension f (e.g., 0.1 mm) in the x-direction.

FIG. 10C shows a top plan view of a second light emitting device having its electrodes coupled to the second pair of conductive pads on the mounting substrate in FIG. 10B, according to the third implementation of the present disclosure. As shown in FIG. 10C, conductive pad 1012 is spaced from conductive pad 1014 by dimension o (e.g., 0.15 mm), and conductive pad 1016 is spaced from conductive pad 1018 by dimension l (e.g., 0.15 mm), to meet the minimum separation requirement (0.15 mm) based on the design rules. In the third implementation, the cathode of first light emitting device 1020 and the anode of second light emitting device 1040 are electrically connected together as one node.

In FIG. 10C, each conductive pad has a width of dimension k, m, n, or p (e.g., 0.2 mm) in the y-direction. In the third implementation, first light emitting device 1020 and second light emitting device 1040 are mounted on mounting substrate 1010 with no offset in the y-direction. Since the cathode of first light emitting device 1020 and the anode of second light emitting device 1040 are electrically connected, conductive pads 1014 and 1016 are connected to each other without separation.

Similar to the first and second implementations, the separation between first light emitting device 1020 and second light emitting device 1040 is represented by the distance having dimension q (e.g., 0.1 mm), thereby minimizing and substantially eliminating a non-emission region (i.e., a dark spot) that would otherwise have been resulted if light emitting devices were to be arranged on their respective conductive pads in a convention manner on a mounting substrate without offsets and an overlapping region. For example, in comparison to light emitting devices 420 and 440 shown in FIG. 4B having the minimum gap of 0.4 mm, the separation between first light emitting device 1020 and second light emitting device 1040 is 0.1 mm. As a result, by arranging the light emitting devices on the mounting substrate as shown in FIGS. 10A through 10D, the uniformity of luminance distribution of the backlight can be improved.

Also, similar to the first and second implementations, the first pair of conductive pads 1012 and 1016 and the second pair of conductive pads 1014 and 1018 are arranged on mounting substrate 1010 with offsets in both x- and y-directions, and have overlapping region 1050 in the x-direction. In the third implementation, as the electrodes (e.g., electrodes 936 and 938 in FIG. 9A, and electrodes 956 and 958 in FIG. 9B) are disposed asymmetrically on the light-emitting element mounting backboard, the pair of light emitting devices 1020 and 1040 aligned with each other (e.g., along the center lines) along the x-direction. As such, the optical axes of light emitting devices 1020 and 1040 are aligned without an offset (e.g., as shown in FIG. 8B).

FIG. 10D is a schematic circuit diagram showing the first and second light emitting devices and their corresponding electrical connections through the first and second pairs of conductive pads in FIG. 10C, according to the third implementation of the present disclosure. In FIG. 10D, the cathode of second light emitting device 1040 is connected to an LED driver. The anode of second light emitting device 1040 and the cathode of first light emitting device 1020 are connected together in one node. The anode electrode of first light emitting device 1020 is connected to a node, Vf. As such, first light emitting device 1020 and second light emitting device 1040 are connected in series, and can be controlled by a single driver.

Figure 11A:
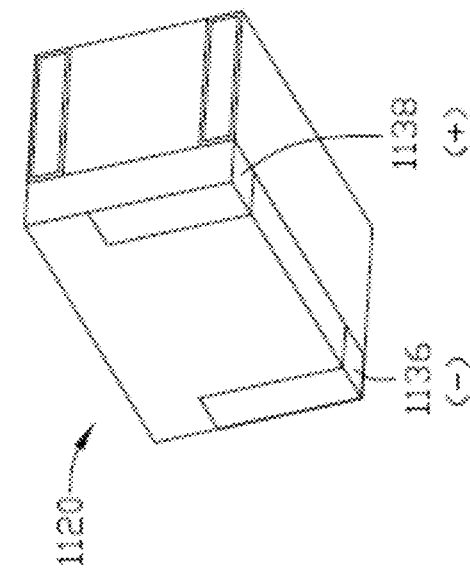
FIG. 11A shows a perspective view of an example light emitting device, according to a fourth implementation of the present disclosure.
Figure 11B:
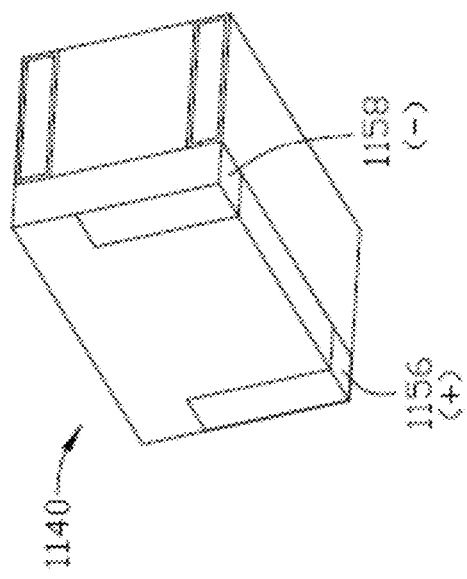
FIG. 11B shows a perspective view of another example light emitting device, according to the fourth implementation of the present disclosure.

FIGS. 11A and 11B each shows a perspective view of a comparative example light emitting device. In FIG. 11A, light emitting device 1120 may be substantially similar to light emitting device 220 in FIG. 2A, except that electrode 1138 is an anode and electrode 1136 is a cathode. In FIG. 11B, second light emitting device 1140 may be substantially similar to light emitting device 220 in FIG. 2A, where electrode 1156 (e.g., an anode) may correspond to electrode 236, and electrode 1158 (e.g., a cathode) may correspond to electrode 238.

Figure 11C:
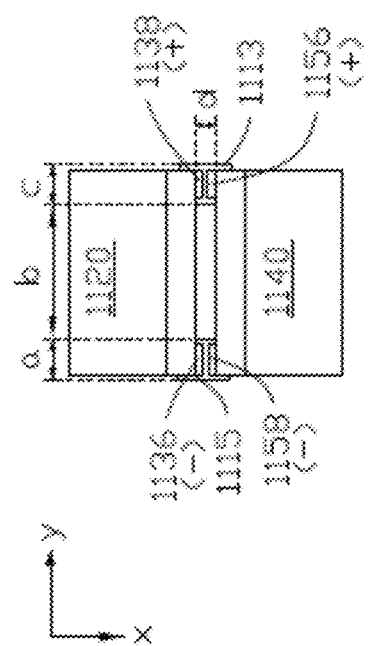
FIG. 11C shows a top plan view of a first light emitting device and a second light emitting device having their electrodes coupled in parallel through conductive pads on a mounting substrate, according to the fourth implementation of the present disclosure.
Figure 11D:
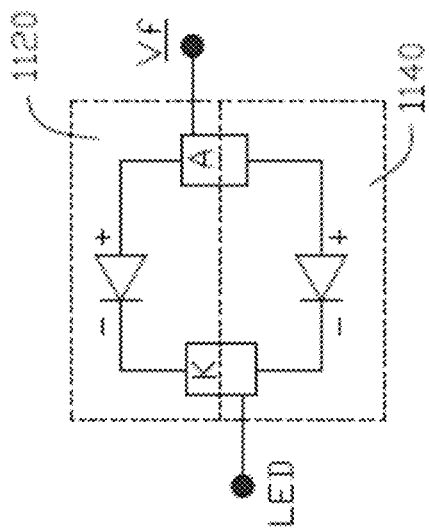
FIG. 11D is a schematic circuit diagram showing the first and second light emitting devices and their corresponding electrical connections through the first and second pairs of conductive pads in FIG. 11C, according to the fourth implementation of the present disclosure.

As the polarities of electrodes 1156 and 1158 of second light emitting device 1140 are opposite of the polarities of electrodes 1136 and 1138 of first light emitting device 1120, second light emitting device 1140 can be connected in parallel with first light emitting device 1120 by connecting electrodes 1136 and 1158 and connecting electrodes 1138 and 1156 through conductive pads on a mounting substrate as shown in FIGS. 11C and 11D.

FIG. 11C shows a top plan view of an example first light emitting device and an example second light emitting device having their electrodes coupled in parallel through conductive pads on a mounting substrate. As shown in FIG. 11C, first light emitting device 1120 includes electrode a cathode) 1136 coupled to conductive pad 1115 and electrode (e.g., an anode) 1138 coupled to conductive pad 1113. Also, second light emitting device 1140 includes electrode (e.g., a cathode) 1158 coupled to conductive pad 1115 and electrode (e.g., an anode) 1156 coupled to conductive pad 1113. In one implementation, each of conductive pads 1113 and 1115 has a width dimension a or c and are separated by dimension b. The separation between first light emitting device 1120 and second light emitting device 1140 is represented by a distance having dimension d.

FIG. 11D is a schematic circuit diagram showing the first and second light emitting devices and their corresponding electrical connections through the first and second conductive pads in FIG. 11C. In FIG. 11D, the cathode of first light emitting device 1120 and the cathode of second light emitting device 1140 are connected together to a common driver through common conductive pad 1115. The anode of first light emitting device 1120 and the anode of second light emitting device 1140 are connected together to a node, Vf, through common conductive pad 1113. As such, first light emitting device 1120 and second light emitting device 1140 are connected in parallel.

However, in the comparative example shown in FIGS. 11C and 11D, variations in voltage and current characteristics are large when a pair of light emitting diodes (e.g., light emitting devices 1120 and 1140) are connected in parallel. Thus, even when the pair is supplied with a common Vf, each light emitting diode of the pair may have a different current going through to emit light. This may result in unevenness of the emitted light which may not be beneficial. Thus, it may be undesirable for a pair of light emitting devices to be connected in parallel as shown in FIGS. 11C and 11D.

FIG. 12 shows an LCD device having a lighting device, according to an implementation of the present disclosure. In FIG. 12, LCD device 1298 may include lighting device 1200 having a plurality of regions, (e.g., 16 by 32 regions), each region having one pair of light emitting devices (e.g., side-emitting light devices) 1220 and 1240. There are 512 pair of light emitting devices (e.g., side-emitting light devices) totally in lighting device 1200. In the present implementation, a 15.6 type size LCD panel including backlight is divided into virtual 16 columns by 32 rows of regions. Each region is arranged to have one pair of light emitting devices 1220 and 1240 to configure lighting device 1200. The light emission of each region of lighting device 1200 can be controlled individually. Thus, the brightness of lighting device 1200 can be adjusted based on each region.

Figure 13:
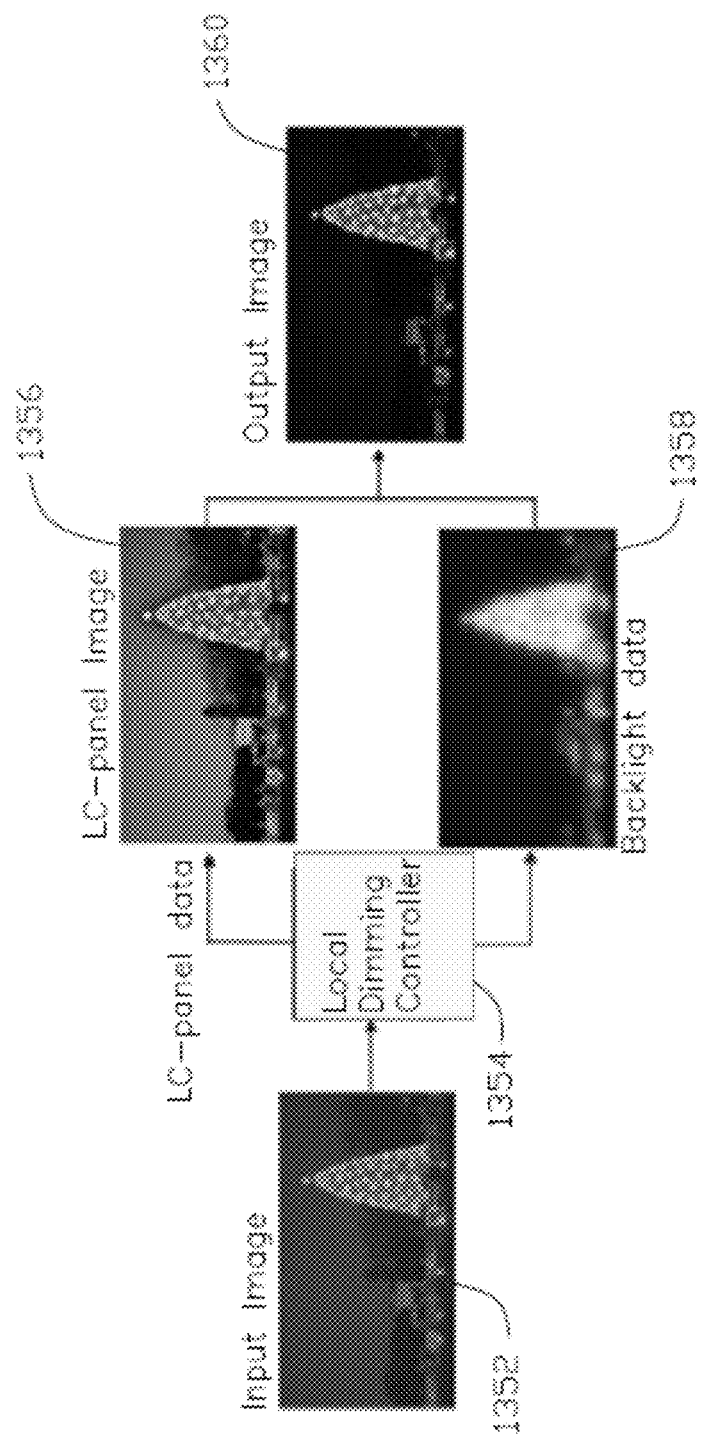
FIG. 13 is a schematic diagram of local dimming control, according to various implementations of the present disclosure.
Figure 14A:
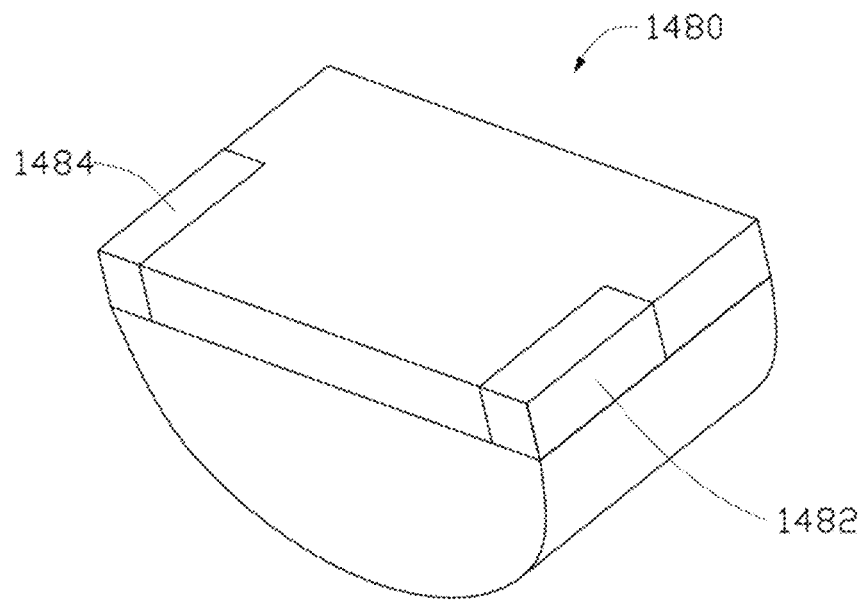
FIG. 14A shows a perspective view of a related art light emitting device.
Figure 14B:
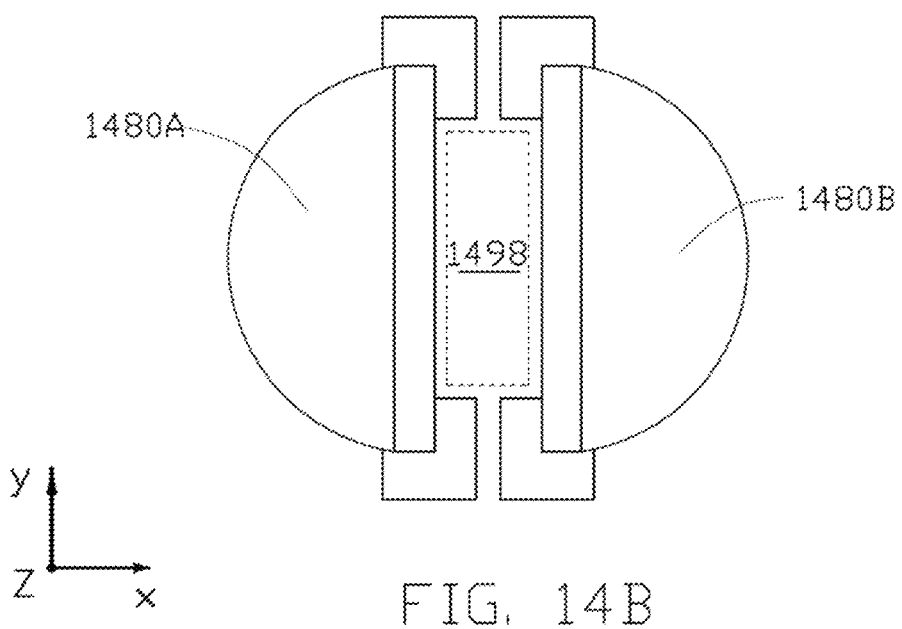
FIG. 14B shows a top plan view of two of the related art light emitting devices illustrated in FIG. 14A, each having electrodes coupled to their corresponding landing pads.

FIG. 13 is a schematic diagram of local dimming control, according to various implementations of the present disclosure. As shown in FIG. 13, local dimming controller 1354 may receive input image 1352, separate input image 1352 to liquid crystal (LC)-panel image data 1356 and backlight data 1358. Backlight data 1358 may be controlled by local dimming controller by controlling the luminance distribution of the backlight in accordance with the display image. Thereafter, LC-panel image data 1356 and backlight data 1358 may be combined to form output image 1360.

Implementations described with reference to FIGS. 1A through 13 above, may provide various solutions to realize local dimming control and substantially eliminate the non-emission regions to achieve uniform luminance distribution of the backlight.

The following description contains specific information pertaining to exemplary implementations in the present disclosure. The drawings in the present disclosure and their accompanying detailed description are directed to merely exemplary implementations. However, the present disclosure is not limited to merely these exemplary implementations. Other variations and embodiments of the present disclosure will occur to those skilled in the art. Unless noted otherwise, like or corresponding elements among the figures may be indicated by like or corresponding reference numerals. Moreover, the drawings and illustrations in the present disclosure are generally not to scale, and are not intended to correspond to actual relative dimensions.

The description uses the phrases "in one implementation," or "in some implementations," which may each refer to one or more of the same or different implementations. The term "coupled" is defined as connected, whether directly or indirectly through intervening components, and is not necessarily limited to physical connections. The term "comprising," when utilized, means "including, but not necessarily limited to"; it specifically indicates open-ended inclusion or membership in the so-described combination, group, series and the equivalent.

From the above description it is manifest that various techniques can be used for implementing the concepts described in the present disclosure without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present disclosure is not limited to the particular implementations described above, but many rearrangements, modifications, and substitutions are possible without departing from the scope of the present disclosure.

What is claimed is:

1. A lighting device comprising:
 a mounting substrate comprising a first pair of conductive pads and a second pair of conductive pads arranged along a first direction on the mounting substrate, the first pair of conductive pads being offset from the second pair of conductive pads in the first direction and a second direction intersecting the first direction with respect to a plane parallel to the mounting substrate;
 a first light emitting device coupled to the first pair of conductive pads, and being configured to emit lights toward a first side within a space formed between the mounting substrate and a diffusion plate;
 a second light emitting device coupled to the second pair of conductive pads, and being configured to emit lights toward a second side opposite of the first side within the space formed between the substrate and the diffusion plate, wherein
 the first pair of conductive pads includes a first conductive pad and a third conductive pad to which a first electrode and a second electrode of the first light emitting device are connected respectively;
 the second pair of conductive pads includes a second conductive pad and a fourth conductive pad to which a third electrode and a fourth electrode of the second light emitting device are connected respectively;
 the first, second, third, and fourth conductive pads are disposed in alternately offset positions,
 the second and third conductive pads are connected to each other to form a single node such that the first light emitting device and the second light emitting device are connected in series with each other, wherein
 the first light emitting device and the second light emitting device are controlled by a single driver.

2. The lighting device of claim 1, wherein the first pair of conductive pads overlaps with the second pair of conductive pads along the second direction in an overlapping region.

3. The lighting device of claim 1, wherein:
 each of the first and second light emitting devices includes a first electrode and a second electrode;
 the first and second electrodes are arranged symmetrically with respect to a center line parallel to the first and second electrodes and on a surface of a light emitting element mounting backboard of the respective first or second light emitting device;
 the center line of the first light emitting device and the center line of the second light emitting device are offset from each other.

4. The lighting device of claim 1, wherein:
 each of the first and second light emitting devices include a first electrode and a second electrode;
 the first and second electrodes are arranged asymmetrically with respect to a center line parallel to the first and second electrodes and on a surface of a light emitting element mounting backboard of the respective first or second light emitting device;
 the center line of the first light emitting device and the center line of the second light emitting device are aligned with each other.

5. The lighting device of claim 1, wherein at least one of the first and second light emitting devices is a side-emitting light device comprising:
 a light-emitting element disposed on a light-emitting element mounting backboard;
 a sealing resin covering the light-emitting element;
 a first electrode and a second electrode coupled to the light-emitting element.

6. The lighting device of claim 5, wherein the side-emitting light device further comprises at least one of:
 a top reflector layer covering a top surface of the sealing resin, and a bottom reflector layer covering a bottom surface of the sealing resin.

7. The lighting device of claim 5, wherein the light-emitting element is mounted on the light-emitting element mounting backboard at a position closer to a bottom surface than to a top surface of the sealing resin.

8. The lighting device of claim 1 further comprising:
a diffusion plate over the first and second light emitting device;
a diffusion sheet between the diffusion plate and an optical sheet.

9. The lighting device of claim 1, wherein each of the first and second light emitting devices includes a light emitting diode (LED).

10. The lighting device of claim 3, wherein the first and second electrodes of the first light emitting device are offset from the first and second electrodes of the second light emitting device in the first and second directions parallel to the plane of the mounting substrate.

11. The lighting device of claim 4, wherein the first and second electrodes of the first light emitting device are offset from the first and second electrodes of the second light emitting device in the first and second directions parallel to the plane of the mounting substrate.

12. A liquid crystal display device comprising the lighting device of claim 1.

13. The liquid crystal display (LCD) device of claim 12, wherein:
a plurality of the lighting devices is divided into virtual targets in one or more regions; and
the LCD device is configured to control an emission intensity of the plurality of the light emitting devices for each of the one or more regions based on a display image.

* * * * *